(12) United States Patent
Kuo et al.

(10) Patent No.: US 12,057,468 B2
(45) Date of Patent: Aug. 6, 2024

(54) SEMICONDUCTOR DEVICE WITH INDUCTOR WINDINGS AROUND A CORE ABOVE AN ENCAPSULATED DIE

(71) Applicant: Taiwan Semiconductor Manufacturing Company, Ltd., Hsinchu (TW)

(72) Inventors: Chien-Hsien Kuo, Hsinchu (TW); Hon-Lin Huang, Hsinchu (TW); Han-Yi Lu, Hsinchu (TW); Ching-Wen Hsiao, Hsinchu (TW); Alexander Kalnitsky, San Francisco, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 651 days.

(21) Appl. No.: 17/144,121

(22) Filed: Jan. 7, 2021

(65) Prior Publication Data
US 2022/0216295 A1 Jul. 7, 2022

(51) Int. Cl.
| | |
|---|---|
| *H01F 17/00* | (2006.01) |
| *H01F 17/04* | (2006.01) |
| *H01F 41/04* | (2006.01) |
| *H01L 49/02* | (2006.01) |

(52) U.S. Cl.
CPC ......... *H01L 28/10* (2013.01); *H01F 17/0013* (2013.01); *H01F 17/0033* (2013.01); *H01F 17/04* (2013.01); *H01F 41/046* (2013.01); *H01F 2017/0086* (2013.01)

(58) Field of Classification Search
CPC .............. H01F 17/0013; H01F 41/046; H01F 41/041–042; H01F 2017/002; H01F 2017/0086; H01F 2017/0073; H01F 27/2804; H01F 2027/2809; H01F 17/0033; H01F 17/04; H01F 2017/0066; H01L 28/10
See application file for complete search history.

(56) References Cited

U.S. PATENT DOCUMENTS

| | | | |
|---|---|---|---|
| 10,164,001 B1 * | 12/2018 | Lee | H01L 24/05 |
| 2013/0056847 A1 * | 3/2013 | Chen | H01F 27/29 |
| | | | 257/E29.325 |

(Continued)

FOREIGN PATENT DOCUMENTS

| | | |
|---|---|---|
| TW | 201731022 | 9/2017 |
| TW | 202011470 | 3/2020 |

OTHER PUBLICATIONS

"Office Action of Taiwan Counterpart Application", issued on Oct. 25, 2021, p. 1-p. 8.

*Primary Examiner* — Younes Boulghassoul
(74) *Attorney, Agent, or Firm* — JCIPRNET

(57) ABSTRACT

An inductor includes a core and a conductive spiral wound around the core. The core includes a buffer layer, an etch stop layer, and a core material layer sequentially stacked. The core material layer includes a ferromagnetic material. A total area of a vertical projection of the core material layer is smaller than an area occupied by the etch stop layer. The vertical projection of the core material layer falls entirely on the etch stop layer. The etch stop layer horizontally protrudes with respect to the core material layer.

20 Claims, 42 Drawing Sheets

(56) References Cited

U.S. PATENT DOCUMENTS

| | | | |
|---|---|---|---|
| 2015/0340422 A1* | 11/2015 | Lee ........................ | H01L 24/80 |
| | | | 438/3 |
| 2017/0098606 A1* | 4/2017 | Lu ..................... | H01L 23/53295 |
| 2018/0366536 A1* | 12/2018 | Hsu ..................... | H01L 23/5226 |
| 2019/0295972 A1* | 9/2019 | Tsai ...................... | H01L 23/481 |
| 2020/0066830 A1* | 2/2020 | Bharath ............ | H01L 23/49822 |
| 2020/0144358 A1* | 5/2020 | Koduri ................... | H01L 28/10 |
| 2020/0295121 A1* | 9/2020 | Liao ................ | H01L 23/49838 |
| 2020/0312766 A1* | 10/2020 | Bhagavat ............ | H01L 21/6836 |
| 2020/0321431 A1* | 10/2020 | Ku ......................... | H01L 28/10 |
| 2022/0344260 A1* | 10/2022 | Tange ................ | H01F 27/2804 |

\* cited by examiner

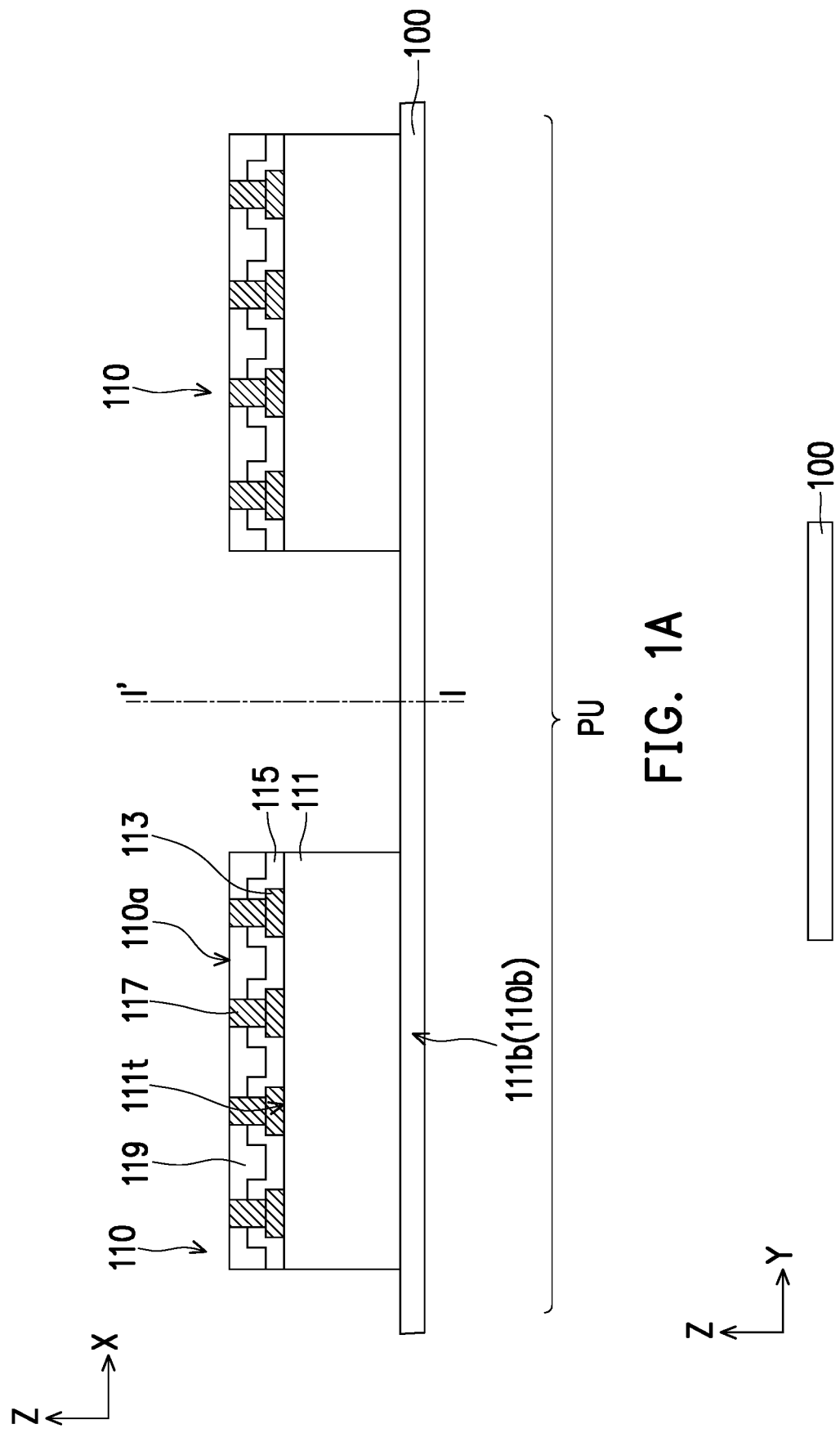

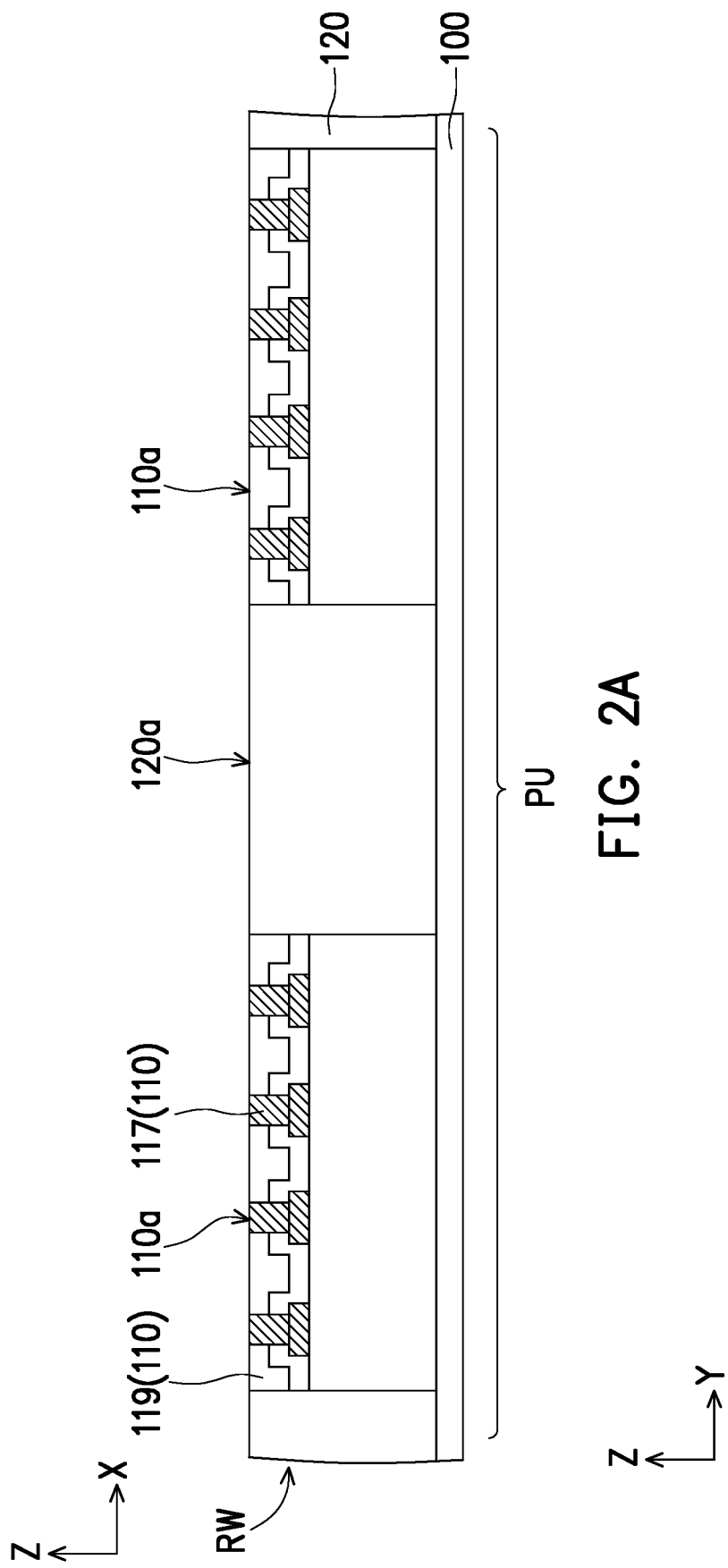
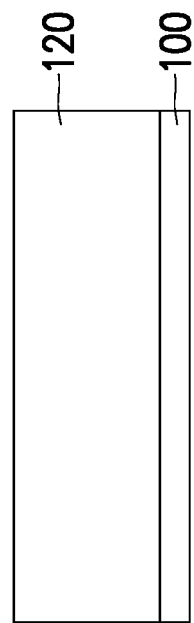
FIG. 2A
FIG. 2B

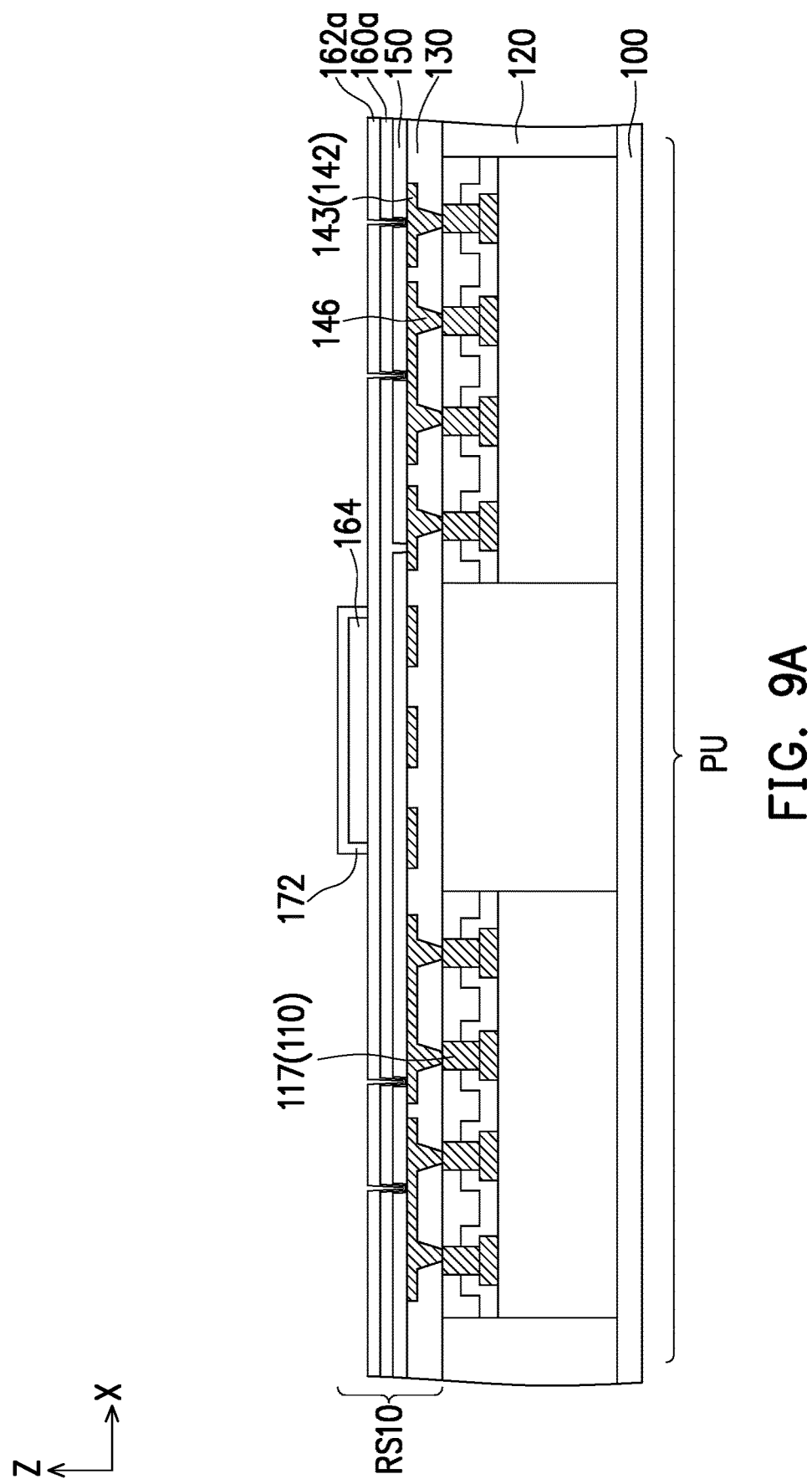

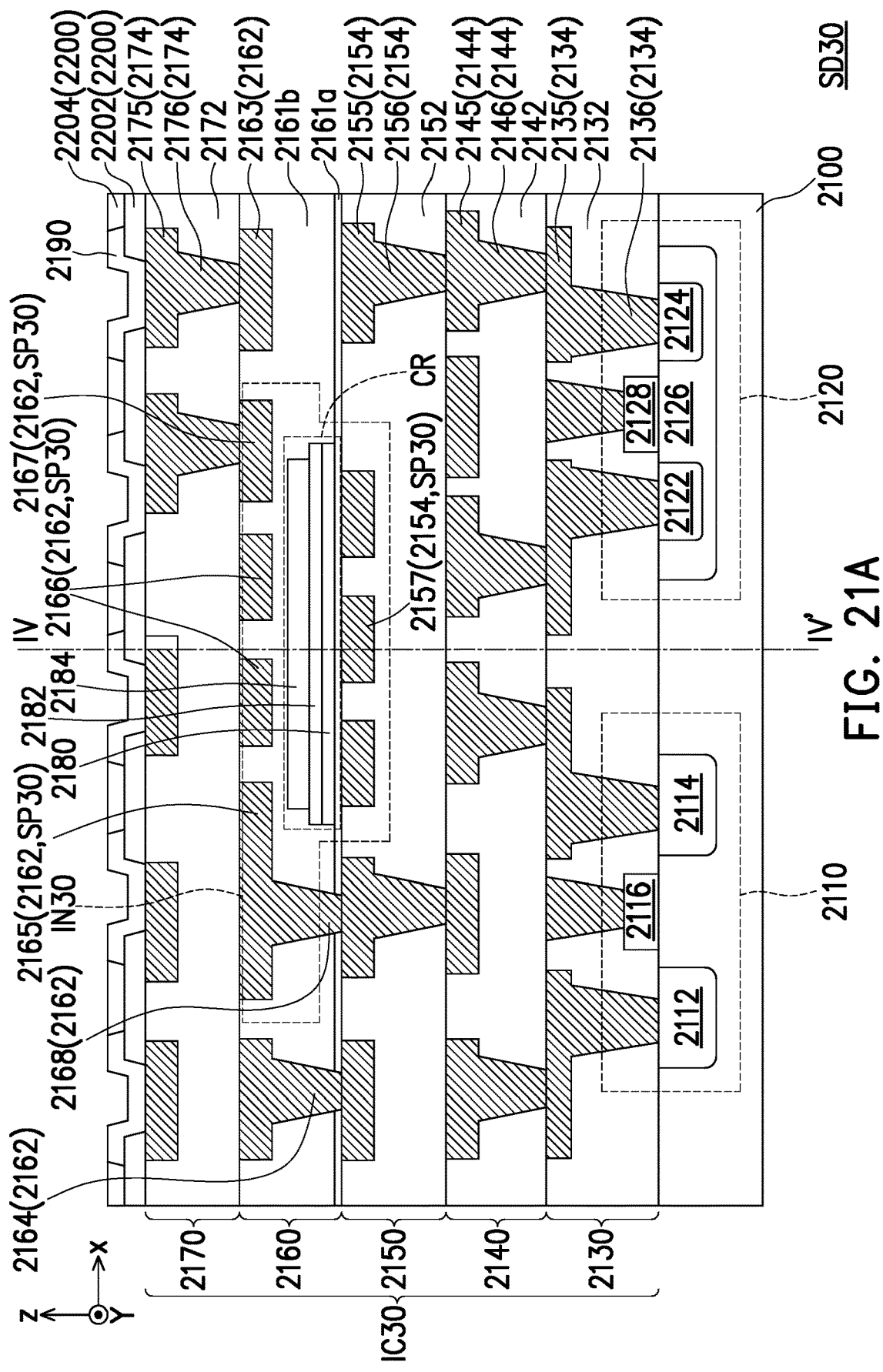

SEMICONDUCTOR DEVICE WITH INDUCTOR WINDINGS AROUND A CORE ABOVE AN ENCAPSULATED DIE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 15A are schematic cross-sectional views illustrating structures produced during a manufacturing process of a semiconductor device according to some embodiments of the disclosure.

FIG. 1B to FIG. 15B are schematic cross-sectional views of the structures of FIG. 1A to FIG. 15A taken along a different plane according to some embodiments of the disclosure.

FIG. 21A and FIG. 21B are schematic cross-sectional views of a semiconductor device according to some embodiments of the disclosure.

DETAILED DESCRIPTION

Figure 3A:
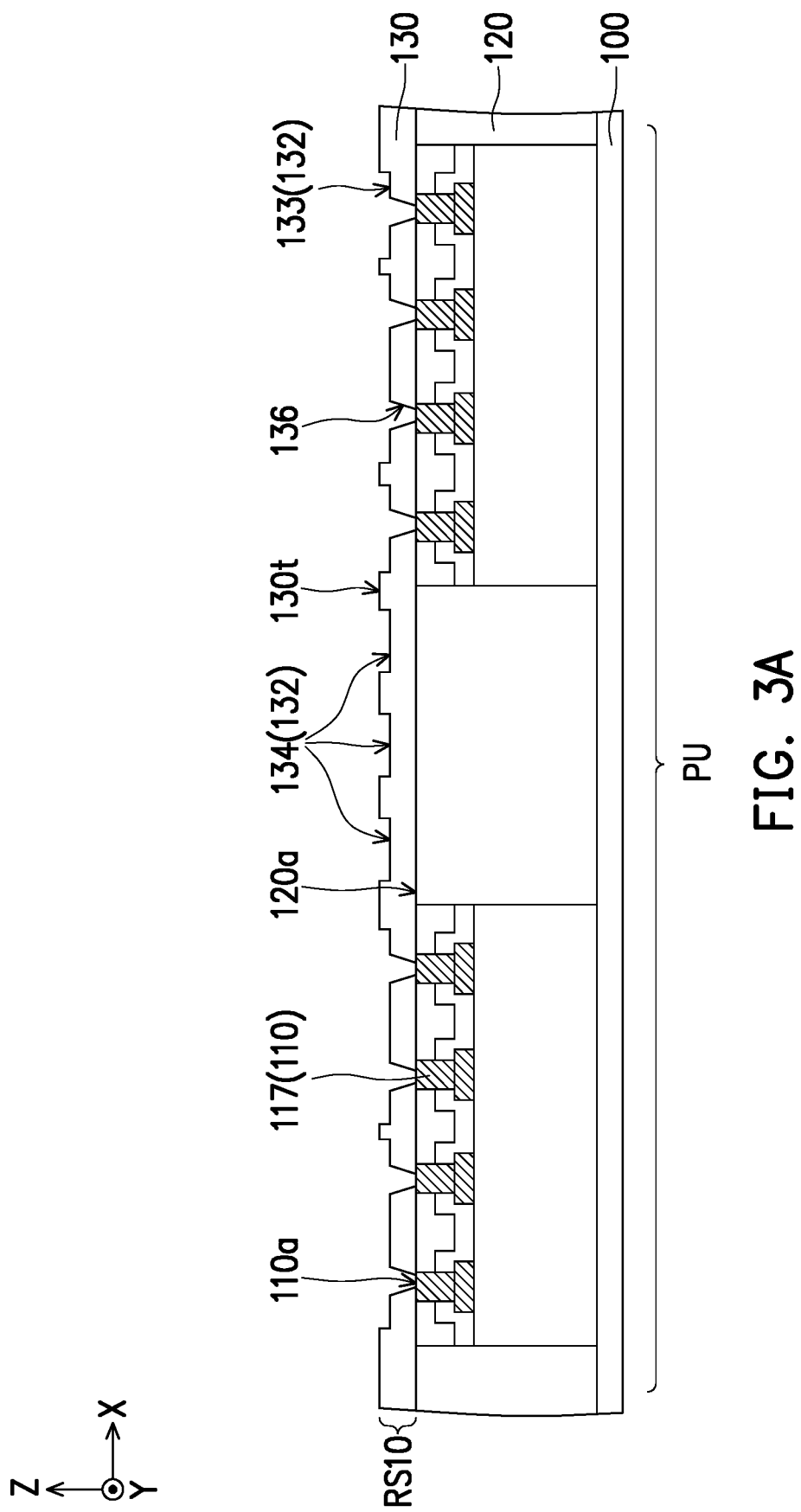

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 15A are schematic cross-sectional views illustrating structures produced during a manufacturing process of a semiconductor device SD10 in accordance with some embodiments of the disclosure. FIG. 1B to FIG. 15B are schematic cross-sectional views of the structures of FIG. 1A to FIG. 15A, respectively, taken in a YZ plane at the level height of the line I-I' along the X direction. The cross-sectional views of FIG. 1A to FIG. 15A have been taken in a XZ plane at the level height of the line II-II' (illustrated in FIG. 17A) along the Y direction, where the X, Y, and Z directions define a set of orthogonal Cartesian coordinates.

In FIG. 1A and FIG. 1B, a carrier 100 is provided. In some embodiments, the carrier 100 is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier 100. The de-bonding layer may include a light-to-heat conversion (LTHC) release layer, which facilitates peeling the carrier 100 away when required by the manufacturing process.

Semiconductor dies 110 are provided on the carrier 100. The semiconductor dies 110 may be placed onto the carrier 100 through a pick-and-place method. In some embodiments, a plurality of semiconductor dies 110 is provided on the carrier 100 to produce multiple package units PU with wafer-level packaging technology. Even though only two semiconductor dies 110 are illustrated in a package unit PU in FIG. 1A for illustrative purposes, it is understood that a semiconductor device according to some embodiments of the disclosure may contain fewer or more than two semiconductor dies 110, according to production requirements.

Each of the semiconductor dies 110 included in a package unit PU may independently be a bare die or a packaged die, where the packaged die may include one or more chips stacked on each other, enclosed in an encapsulant, and/or having an encapsulant formed thereon. While in FIG. 1A the semiconductor dies 110 are illustrated as bare dies, the disclosure is not limited thereto. In some embodiments, a semiconductor die 110 includes a semiconductor substrate 111, a plurality of contact pads 113, and a passivation layer 115. The contact pads 113 may be formed over a top surface 111t of the semiconductor substrate 111. The passivation layer 115 may cover the top surface 111t and have a plurality of openings that exposes at least a portion of each contact pad 113. The semiconductor dies 110 are disposed on the carrier C with the backside surfaces 110b facing towards the carrier C. In some embodiments, a semiconductor die 110 further includes a plurality of contact posts 117 filling the openings of the passivation layer 115, thus establishing electrical connection to the contact pads 113. A protective layer 119 may surround the contact posts 117. In some embodiments, the contact posts 117 are exposed by the protective layer 119 at the active surface 110a of the semiconductor die 110. In some alternative embodiments, the contact posts 117 are initially covered by the protective layer 119.

In some embodiments, the semiconductor substrate 111 may include semiconductor materials, such as semiconductor materials of the groups III-V of the periodic table. In some embodiments, the semiconductor substrate 111 includes elemental semiconductor materials, such as crystalline silicon, diamond, or germanium; compound semiconductor materials such as silicon carbide, gallium arsenic, indium arsenide, semiconductor oxides, or indium phosphide or alloy semiconductor materials such as silicon germanium, silicon germanium carbide, gallium arsenic phosphide, or gallium indium phosphide. In some embodiments, the semiconductor substrate 111 has interconnected circuit devices formed therein, including active components (e.g., transistors or the like) and optionally passive components (e.g., resistors, capacitors, inductors, or the like).

In certain embodiments, the contact pads 113 include aluminum pads, copper pads, or other suitable metal pads. In some embodiments, the passivation layer 115 may be single-layered or multi-layered structures, including a silicon oxide layer, a silicon nitride layer, a silicon oxy-nitride layer, a dielectric layer formed by other suitable dielectric materials or combinations thereof. In some embodiments, the material of the contact posts 117 includes copper, copper alloys, or other conductive materials, and may be formed by deposition, plating, or other suitable techniques. In some embodiments, a material of the protective layer 119 may include a polymeric material, such as polyimide, acrylic resin, phenol resin, benzocyclobutene (BCB), polybenzoxazole (PBO), a combination thereof, or other suitable polymer-based dielectric materials.

Each one of the semiconductor dies 110 may independently be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. In some embodiments, the semiconductor dies 110 may also be or include memory dies, such as a high bandwidth memory die. For example, the memory die may be a dynamic random access memory (DRAM), a resistive random access memory (RRAM), a static random access memory (SRAM), or the like. In some embodiments, the semiconductor dies 110 are the same type of dies or perform the same functions. In some embodiments, the semiconductor dies 110 are different types of dies or perform different functions. The disclosure is not limited by the type of dies used for the semiconductor dies 110 within a package unit PU. In some embodiments, one of the semiconductor dies 110 may be a system-on-chip type of die, including multiple functional circuits formed in different regions of the semiconductor substrate 111, and another semiconductor die 110 may be a memory die.

In some embodiments, the semiconductor dies 110 are placed on the carrier 100 with the contact pads 113 and contact posts 117 (if included) facing away from the carrier 100. Backside surfaces 110b of the semiconductor dies 110 face the carrier 100. Portions of die attach film (not shown) may be disposed on the backside surfaces 110b to secure the semiconductor dies 110 to the carrier 100. In some embodiments, the die attach film includes a pressure adhesive, a thermally curable adhesive, or the like.

In FIG. 2A and FIG. 2B, an encapsulant 120 is formed over the carrier 100 to encapsulate the semiconductor dies 110. In some embodiments, a material of the encapsulant 120 includes a molding compound, a polymeric material, such as epoxy resin, acrylic resin, phenol resin, benzocyclobutene (BCB), polybenzoxazole (PBO), a combination thereof, or other suitable polymer-based dielectric materials. In some embodiments, the encapsulant 120 further includes fillers, for example, inorganic fillers such as silica beads, metal oxides, ceramic particles or the like. In some embodiments, the encapsulant 120 may include an epoxy resin in which the fillers are dispersed.

The encapsulant 120 may be originally formed by a molding process (such as a compression molding process) or a spin-coating process so as to completely cover the semiconductor dies 110. Portions of the encapsulant may then be removed, for example during a planarization process, until the contact pads 113 or the contact posts 117 (if included) are exposed. The planarization process may include performing a mechanical grinding process and/or a chemical mechanical polishing (CMP) process. In some embodiments, portions of the protective layer 119 and the contact posts 117 may also be removed during the thinning or planarization process of the encapsulant 120. Following the planarization process, the active surfaces 110a of the semiconductor dies 110 exposing the contact posts 117 and the top surface 120a of the encapsulant 120 may be substantially at a same level height along the Z direction (be substantially coplanar). In some embodiments, the direction Z is normal to the top surface 120a of the encapsulant 120.

With the formation of the encapsulant 120, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 2A, a single package unit PU is shown for simplicity but, of course, this is for illustrative purposes only, and the disclosure is not limited by the number of package units PU being produced in the reconstructed wafer RW.

Figure 3B:
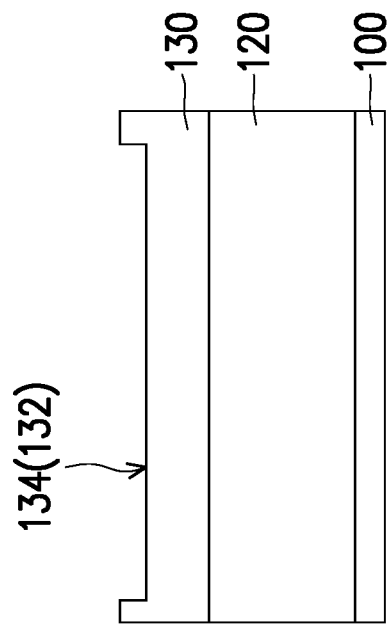
Figure 4A:
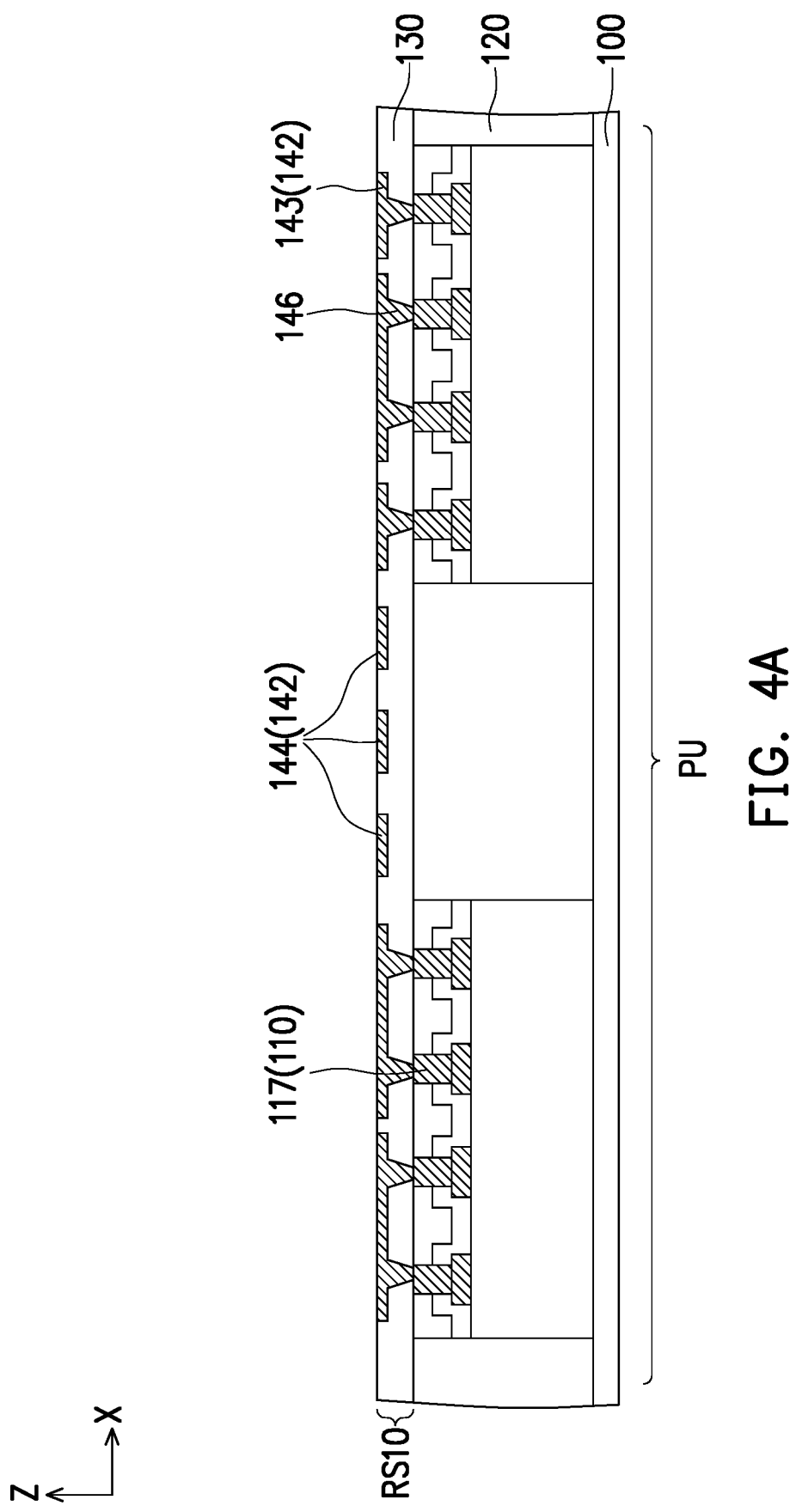
Figure 4B:
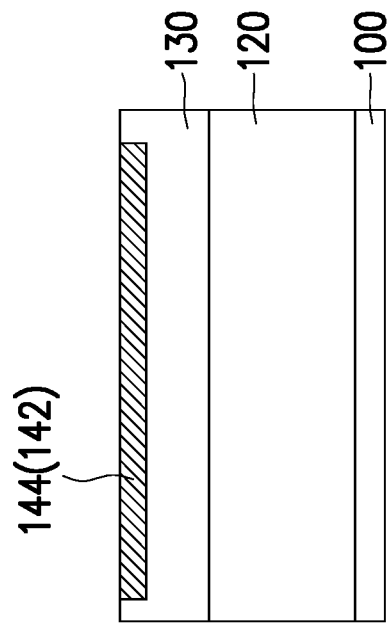

In FIG. 3A and FIG. 3B, a dielectric layer 130 is formed extending over the top surface 120a of the encapsulant 120 and the active surfaces 110a of the semiconductor dies 110a. In some embodiments, the dielectric layer 130 includes trenches 132 and via openings 136 formed therethrough. The trenches 132 may be opened at the top surface 130t of the dielectric layer 130 and have elongated shapes in XY planes while extending along the Z direction for less than the total thickness of the dielectric layer 130. The trenches 132 may include routing trenches 133 and blind trenches 134. The routing trenches 133 are connected to at least one via opening 136. The blind trenches 134 are not connected to the via openings 136 and expose the dielectric layer 130 at their bottom. The blind trenches 134 may be formed as trenches of similar length running substantially parallel to each other along a first direction and disposed at a distance from each other along a second direction. The first and second directions need only be different, but are not limited to be perpendicular. For example, the blind trenches 134 may be formed beside each other along the X direction and extend along the Y direction. In some other examples, the blind trenches are still formed beside each other along the Y direction, but extend in an XY plane at an angle with respect to both the X and Y direction. The via openings 136 extend vertically from the bottom of the routing trenches 133 through the dielectric layer 130 for the entire thickness of the dielectric layer 130. The contact posts 117 of the semiconductor dies 110 are exposed at the bottom of the via openings 136. In some embodiments, a material of the dielectric layer 130 includes polyimide, epoxy resin, acrylic resin, phenol resin, benzocyclobutene (BCB), polybenzooxazole (PBO), any other suitable polymer-based dielectric material, or a combination thereof. In some embodiments, the dielectric layer 130 is obtained by patterning a blanket dielectric layer (not shown) formed by suitable fabrication techniques such as spin-on coating, chemical vapor deposition (CVD), or the like. In some embodiments, the material of the blanket dielectric layer includes a photoactivatable, thermocurable material, such as a photoreactive polyimide which may behave as a positive or negative photoresist. In some embodiments, the blanket dielectric layer is patterned through a sequence of exposure and development steps to form the trenches 132 and the via openings 136. After patterning, the material remaining on the package unit(s) PU is thermally cured to form the dielectric layer 130. In some embodiments, curing may be performed at a temperature in the range from about 200° C. to about 400° C., for a time from about 30 min to about 2 hours, but the disclosure is not limited thereto. In some embodiments, following the thermal treatment the material of the dielectric layer 130 may be no longer developed in the conditions adopted to form the trenches 132 and the via openings 136, so as to resist successive development treatments which may be later performed as required by the manufacturing process. In some embodiments, the dielectric layer 130 may be a bottommost layer of a redistribution structure RS10 being formed on the package units PU.

Referring to FIG. 3A, FIG. 3B, FIG. 4A, and FIG. 4B, in some embodiments, a conductive material is disposed in the trenches 132 and the via openings 136 to form conductive traces 142 and conductive vias 146, respectively. The conductive traces 142 include routing traces 143 formed in the routing trenches 133 and inductor spiral traces 144 formed in the blind trenches 134. The routing traces 143 are electrically connected to the contact posts 117 of the semiconductor dies 110 by the conductive vias 146, which may be referred to as routing vias. In the structures illustrated in FIG. 4A and FIG. 4B, the inductor spiral traces 144 may be electrically floating. In some embodiments, the conductive material of the conductive traces 142 and the conductive vias 146 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by a plating process. The plating process may be, for example, electro-plating, electroless-plating, immersion plating, or the like. In some embodiments, the conductive material may be optionally deposited on a seed layer (not shown).

Figure 5A:
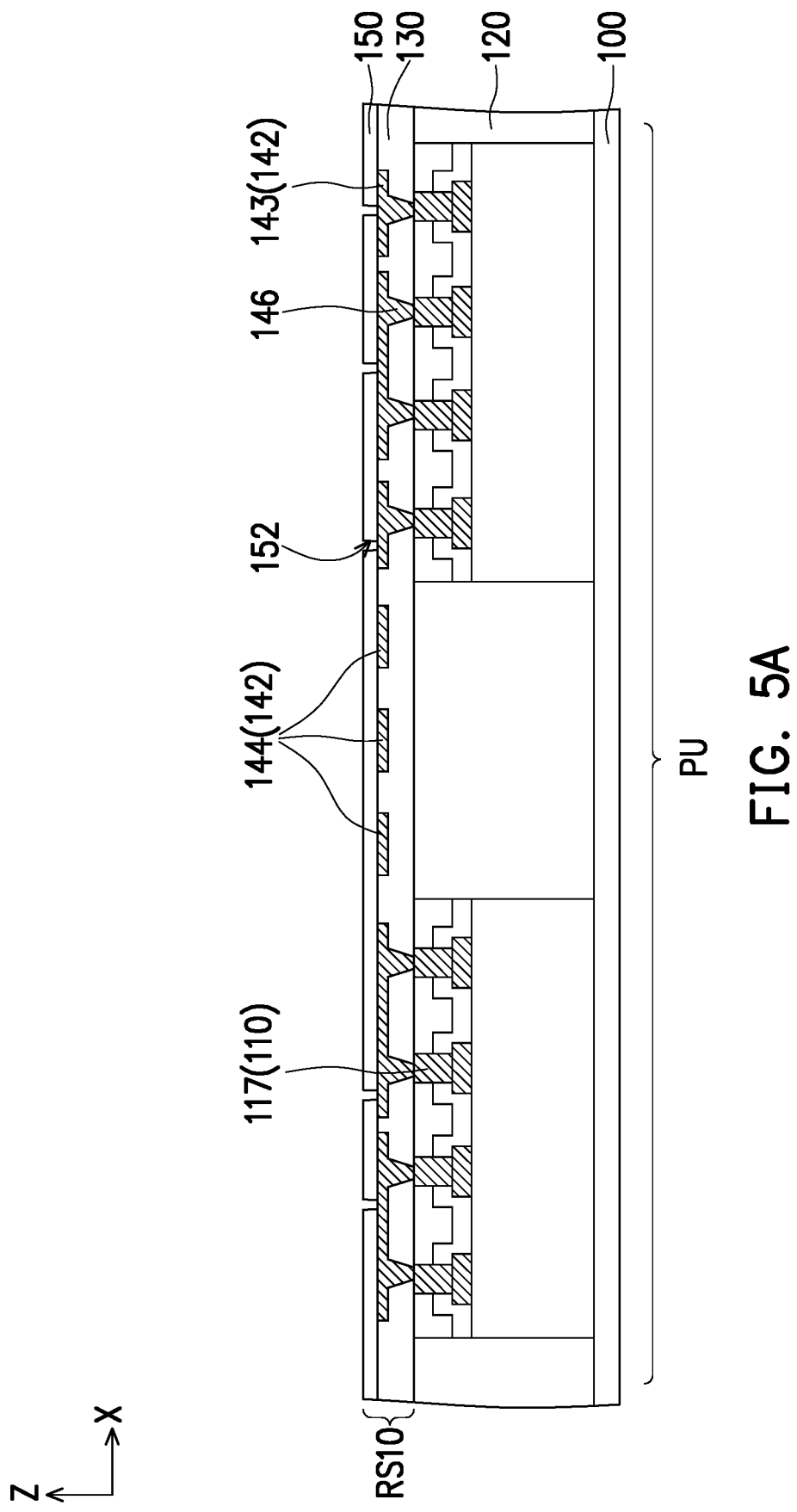
Figure 5B:
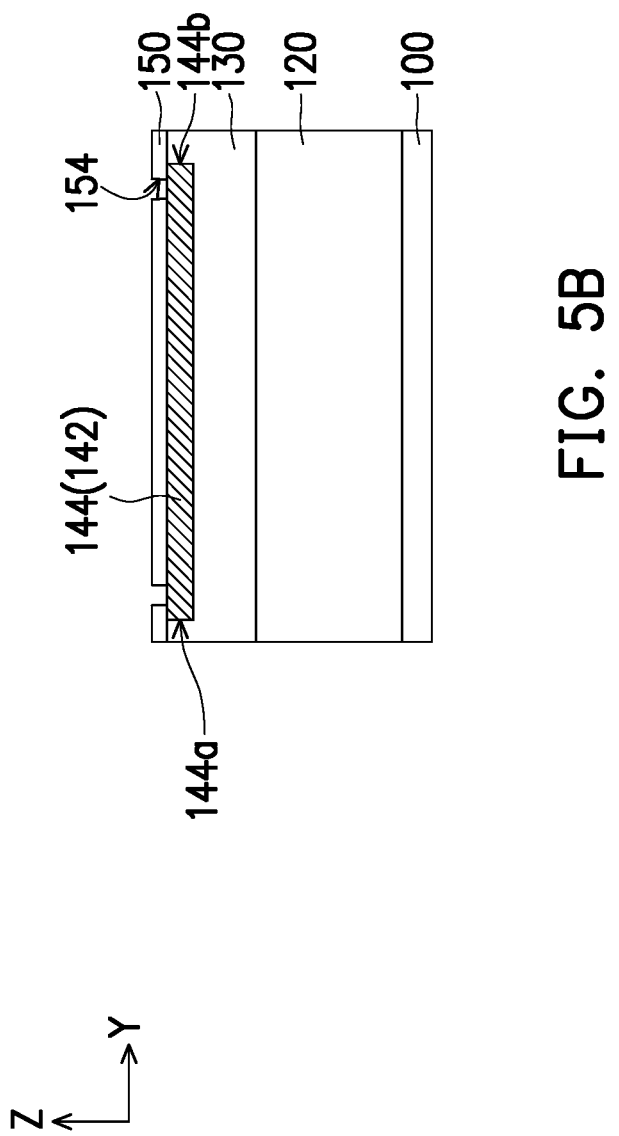

In FIG. 5A and FIG. 5B, a dielectric layer 150 is formed on the dielectric layer 130 and the conductive traces 142. In some embodiments, the dielectric layer 150 includes via openings 152 and 154 extending through the entire thickness of the dielectric layer 150. The via openings 152 expose at their bottom portions of the routing traces 143, while the via openings 154 expose at their bottom opposite ends 144a, 144b of the inductor spiral traces 144. That is, the inductor spiral traces 144 may be elongated strips having opposite ends 144a, 144b, and one via opening 154 may be located in correspondence of each end 144a, 144b of the inductor spiral traces 144. In some embodiments, the dielectric layer 150 may be formed employing similar material and processes as previously described for the dielectric layer 130.

Figure 6A:
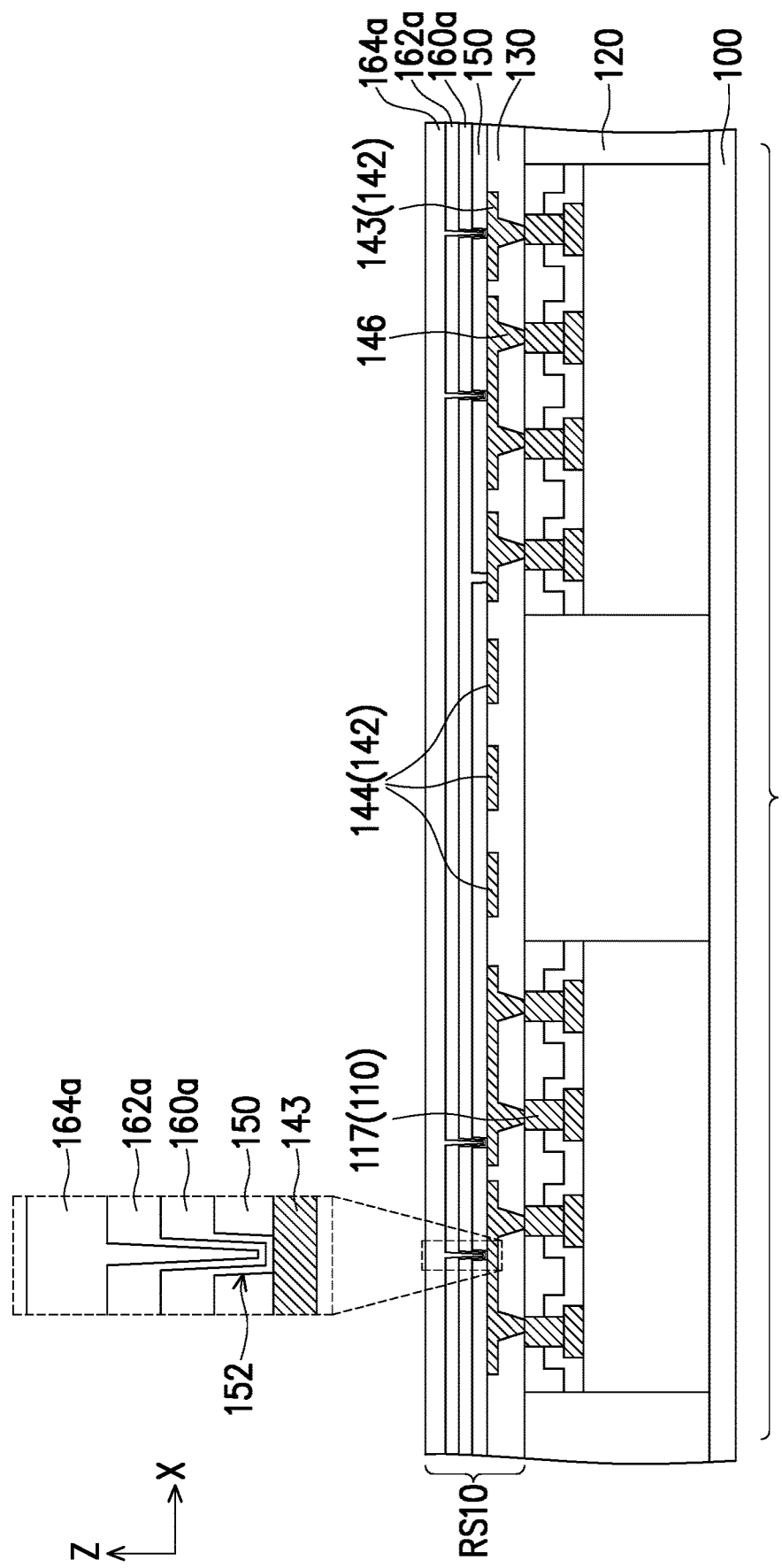
Figure 6B:
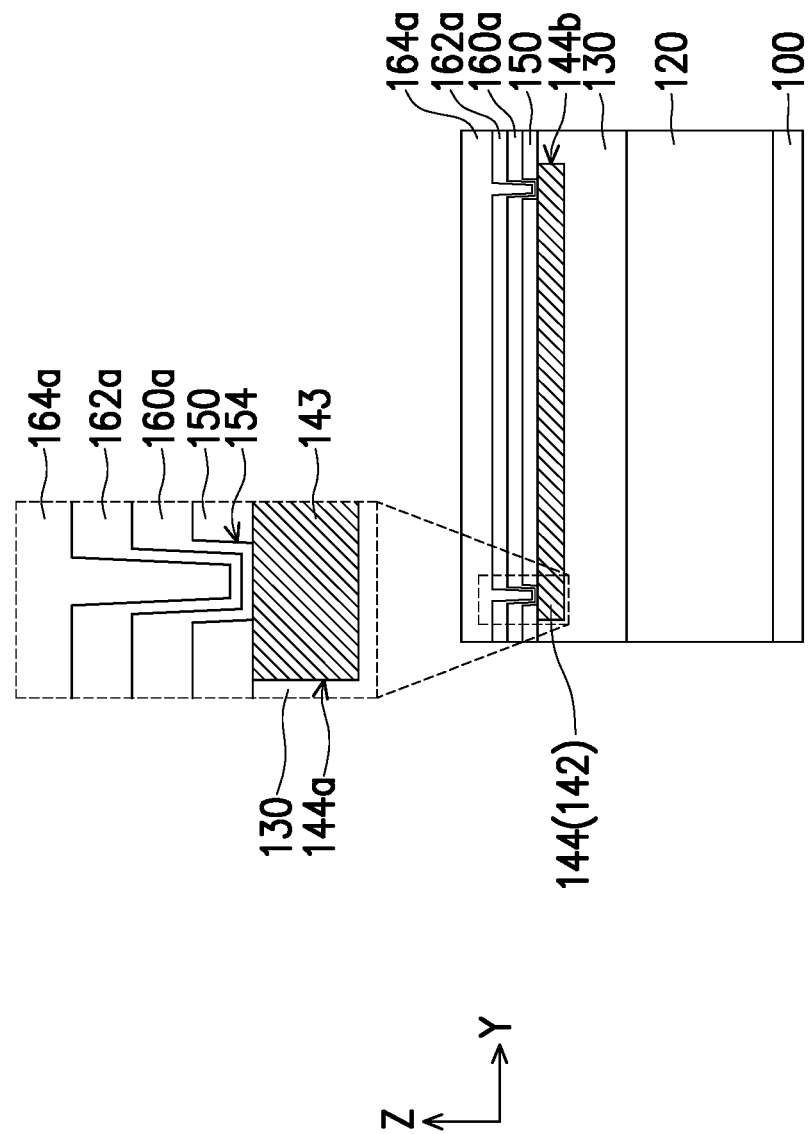

In FIG. 6A and FIG. 6B, a buffer layer 160a, an etch stop layer 162a and a core material layer 164a are sequentially blanketly formed on the dielectric layer 150. In some embodiments, the buffer layer 160a is formed conformally on the dielectric layer 150, extending also along the sidewalls and at the bottom of the via openings 152, 154. That is, the buffer layer 160a may initially contact the conductive traces 142 at the bottom of the via openings 152 and 154. The insets in FIG. 6A and FIG. 6B show some details of the buffer layer 160a, the etch stop layer 162a, and the core material layer 164a in correspondence of the via openings 152, 154.

In some embodiments, the buffer layer 160a includes a silicon-based material, such as elemental silicon or silicon nitride, for example. In some embodiments, the buffer layer 160a is formed by a suitable deposition process, such as sputtering. In some embodiments, the etch stop layer 162a is formed conformally on the buffer layer 160a, extending over the dielectric layer 150 and within the via openings 152 and 154. The etch stop layer 162a includes a material which may be selectively etched with respect to the material of the core material layer 164a. For example, the etch stop layer 162a may include cobalt, tantalum, their oxides, or any other suitable material. In some embodiments, the etch stop layer 162a is formed by a suitable deposition process, such as sputtering. In some embodiments, the core material layer 164a is formed conformally on the etch stop layer 162a. In some embodiments, the core material layer 164a is formed so as to fill the via openings 152, 154 if not already filled by the etch stop layer 162a and the buffer layer 160a. In some embodiments, the core material layer 164a includes a ferromagnetic material. The ferromagnetic material is not particularly limited, as long as it is compatible with semiconductor manufacturing processes. In some embodiments, the ferromagnetic material includes iron, cobalt, nickel, manganese, boron, their alloys, their compounds, a combination thereof, or any other suitable ferromagnetic material. For example, the ferromagnetic material may include NiFe, CoFe, CoFeB, CoZrTa, CoFeTa, CoPt, or the like. In some embodiments, the ferromagnetic material includes CoZrTa. In some embodiments, the stacked buffer layer 160a, etch stop layer 162a, and core material layer 164a may extend all over the package unit(s) PU, and not limited thereto. In some embodiments, the buffer layer 160a may dissipate or attenuate stress generated by the rigidity of the overlying etch stop layer 162a and core material layer 164a.

Figure 7A:
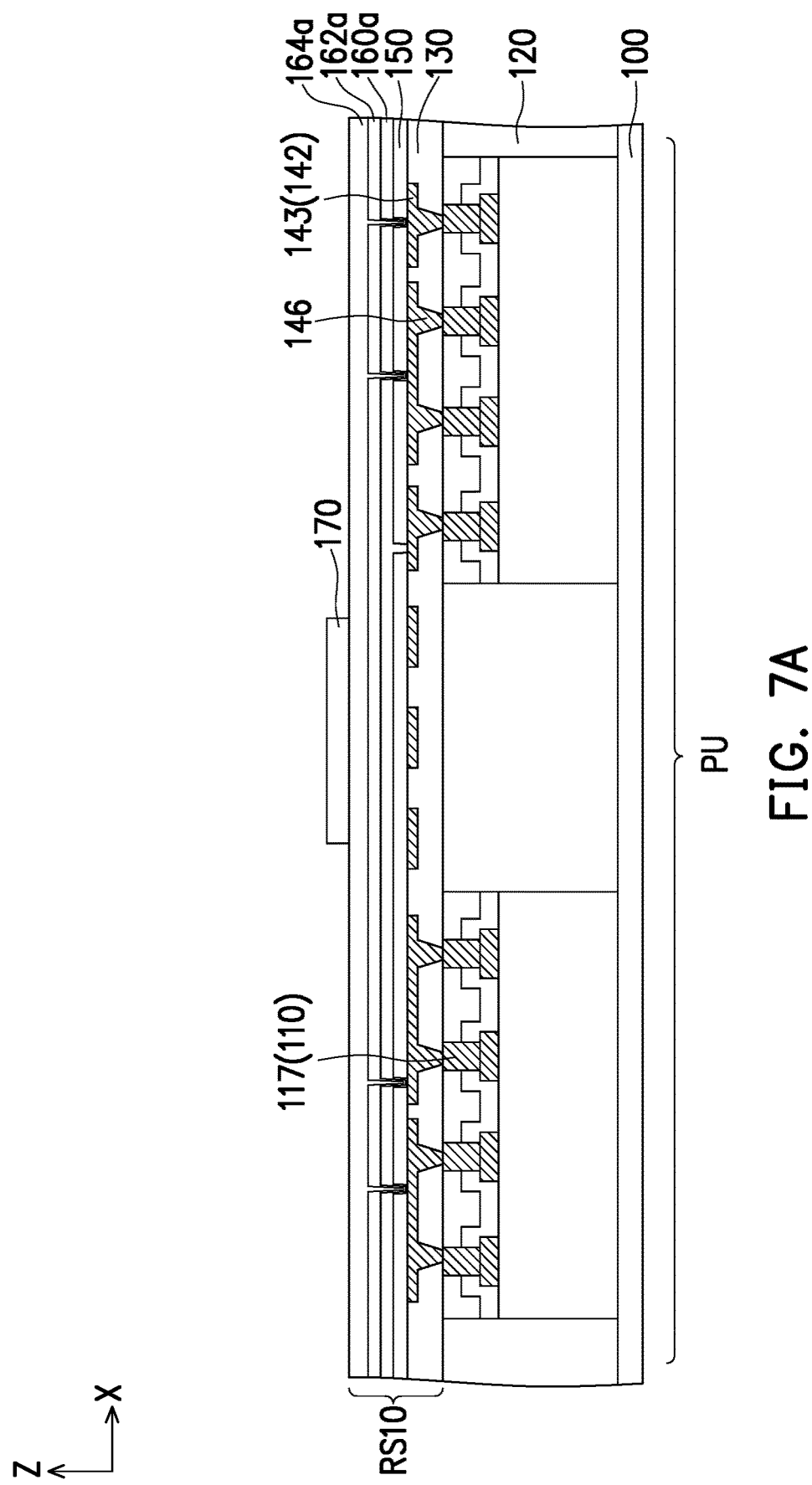
Figure 7B:
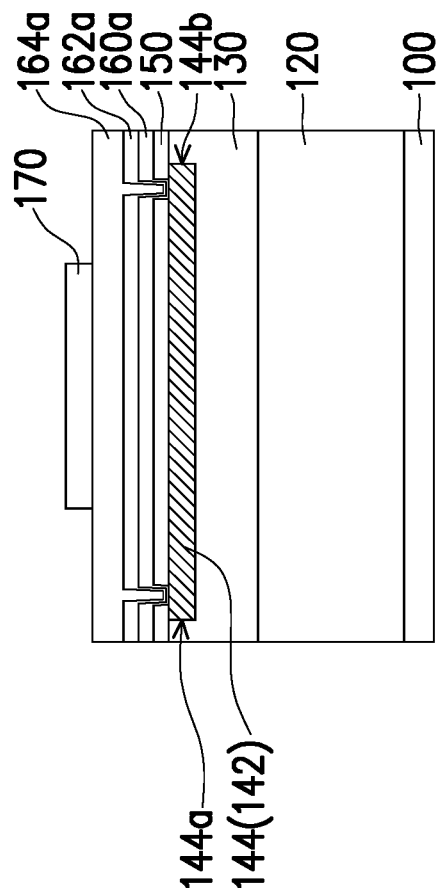

In FIG. 7A and FIG. 7B, an auxiliary mask 170 is provided on the core material layer 164a. In some embodiments, the auxiliary mask 170 extends over the inductor spiral traces 144 leaving exposed other regions of the package unit PU. In some embodiments, a span of the auxiliary mask 170 is such as to extend over all the inductor spiral traces 144 disposed beside each other, and not limited thereto. For example, if the inductor spiral traces 144 are disposed side-by-side along the X direction, the auxiliary mask 170 extends along the X direction so as to extend over the entire group of inductor spiral traces 144. In some embodiments, the auxiliary mask 170 may protrude with respect to the underlying inductor traces 140 along the X direction. The auxiliary mask 170 may not exceed, however, the length of the inductor spiral traces 144 in the extending direction of the inductor spiral traces 144. For example, the auxiliary mask 170 may be such as not to overlap with the via openings 154 formed at opposite ends 144a, 144b of the inductor spiral traces 144. In some embodiments, the auxiliary mask 170 includes a positive or negative photoresist. In some embodiments, the auxiliary mask 170 is formed by deposition, exposure and development of a photoresist material.

Figure 8A:
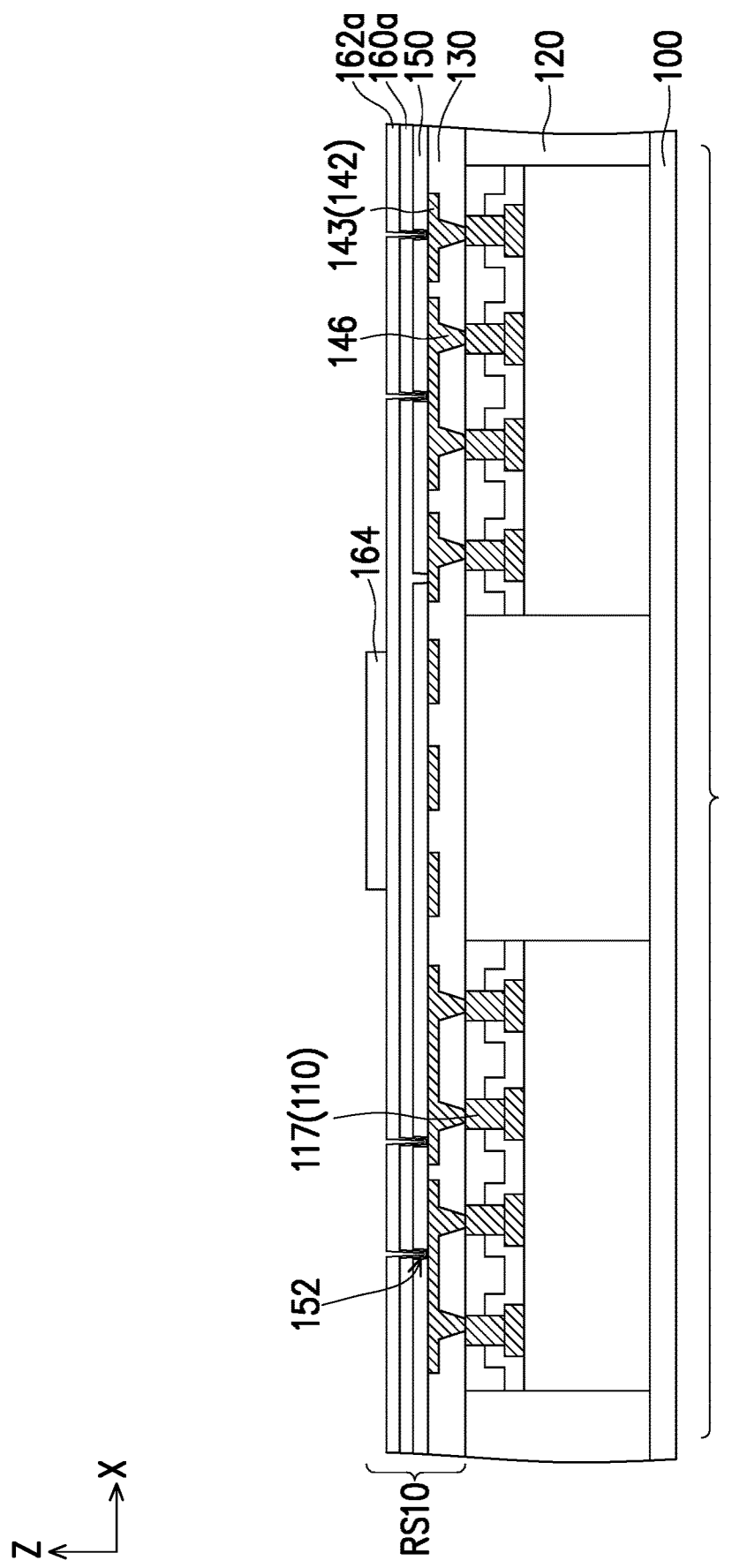
Figure 8B:
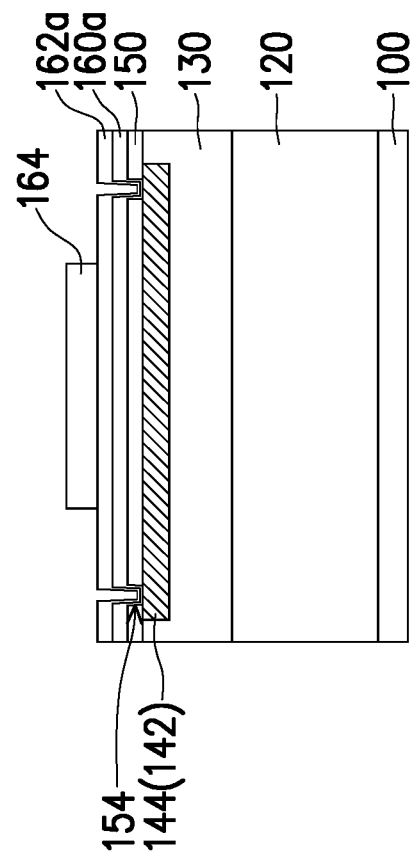

In some embodiments, the pattern of the auxiliary mask 170 is transferred to the core material layer 164a by removing the portions of the core material layer 164a left exposed by the auxiliary mask 170, so as to leave the core material layer 164 only on the region originally covered by the auxiliary mask 170, as illustrated, e.g., in FIG. 8A and FIG. 8B, and not limited thereto. In some embodiments, the core material layer 164 may be patterned for example via etching. Any acceptable etching process may be considered, such as dry etching, wet etching, reactive ion etching (RIE), neutral beam ion etching (NBE), or the like. After patterning the core material layer 164, the etch stop layer 162a and the buffer layer 160a still cover the remaining parts of the package unit(s) PU, for example, extending within the via openings 152 and 154. After patterning of the core material layer 164, the auxiliary mask 170 is removed, for example via ashing or stripping.

Figure 9B:
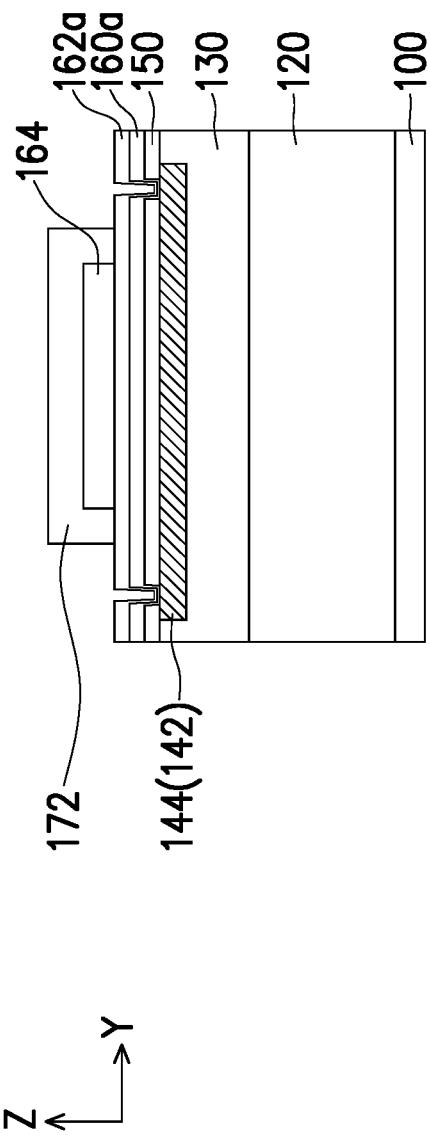
Figure 10A:
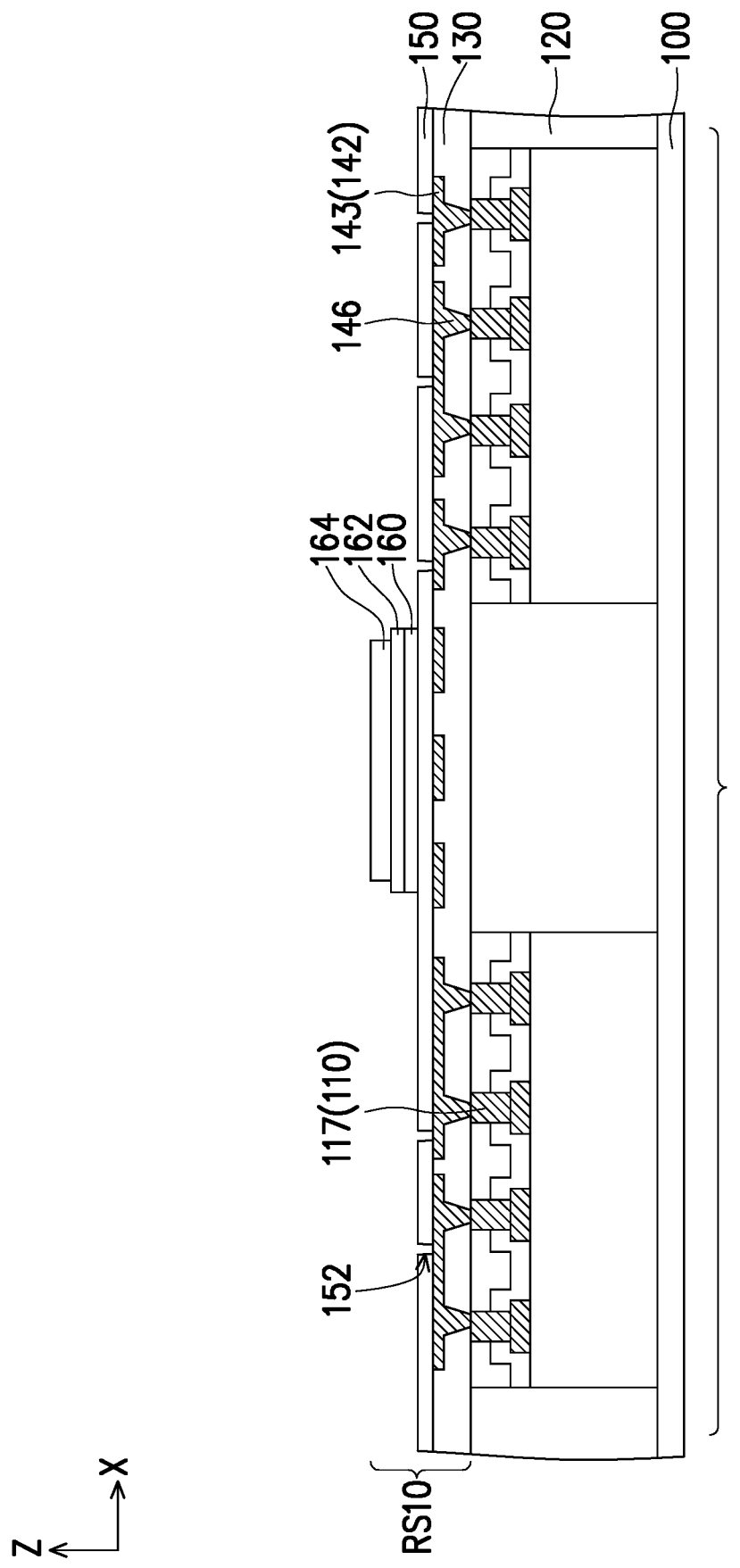
Figure 10B:
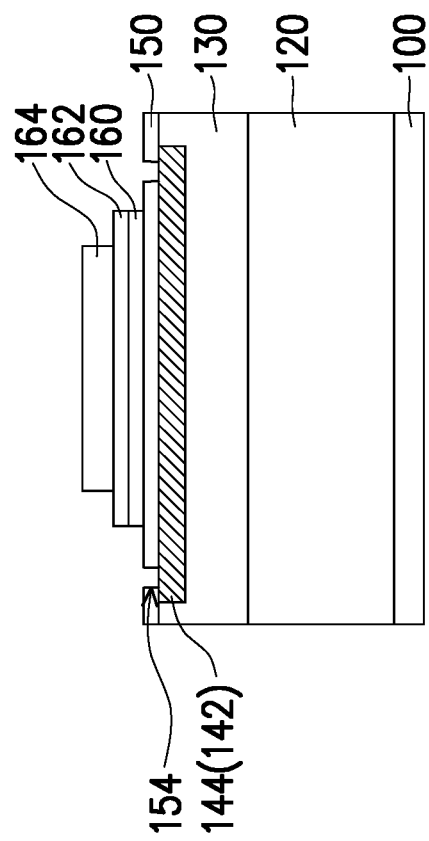

In FIG. 9A and FIG. 9B, an auxiliary mask 172 is formed on the core material layer 164. In some embodiments, the auxiliary mask 172 covers side and top surfaces of the core material layer 164. That is, the core material layer 164 is enclosed by the etch stop layer 162a at the bottom, and by the auxiliary mask 172 at the remaining sides. That is, the footprint of the auxiliary mask 172 is larger than the footprint of the core material layer 164. In some embodiments, the auxiliary mask 172 extends further than the core material layer 164 over the inductor spiral traces 144, without reaching the via openings 154. That is, along the extending direction of the inductor spiral traces 144, the auxiliary mask 172 may reach a position in between the edge of the core material layer 164 and the via openings 154. In some embodiments, the auxiliary mask 172 is formed with similar material and processes as previously described for the auxiliary mask 170.

Referring to FIG. 9A, FIG. 9B, FIG. 10A, and FIG. 10B, the buffer layer 160a and the etch stop layer 162a are patterned using the auxiliary mask 172 as a mask. That is, the portions of the buffer layer 160a and the etch stop layer 162a left exposed by the auxiliary mask 172 are removed, for example during one or more etching step. Any acceptable etching process may be considered, such as dry etching, wet etching, reactive ion etching (RIE), neutral beam ion etching (NBE), or the like. After patterning, the etch stop layer 162 and the buffer layer 160 remains underneath the core material layer 164, and protrude in the XY plane with respect to the overlying core material layer 164, for example without reaching the via openings 154. In some embodiments, the patterning step exposes again the dielectric layer 150, for example in correspondence of the via openings 152 and 154. That is, the etch stop layer 162 and the buffer layer 160 may remain in the package unit PU in a region overlying the inductor spiral traces 144 slightly larger than the region covered by the core material layer 164, while the dielectric layer 150 may be exposed in the remaining portions of the package unit PU. Portions of the routing traces 143 are once again exposed at the bottom of the via openings 152, while portions of the inductor spiral traces 144 are once again exposed at the bottom of the via openings 154. The footprint of the buffer layer 160 may match in shape and size and be overlapped with the footprint of the edge stop layer 162. After patterning of the buffer layer 160 and the etch stop layer 162, the auxiliary mask 172 may be removed, for example via ashing or stripping.

Figure 11A:
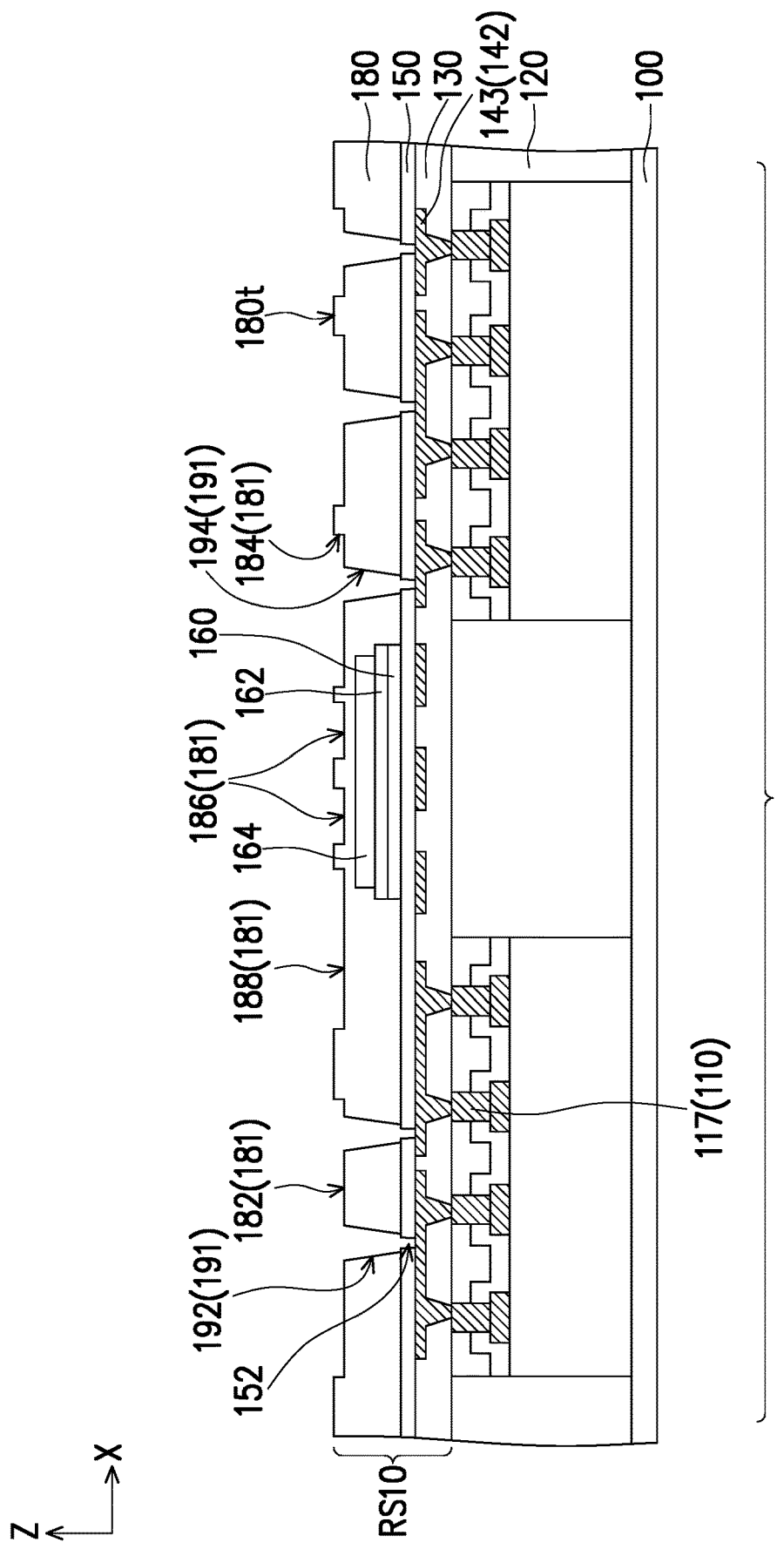
Figure 11B:
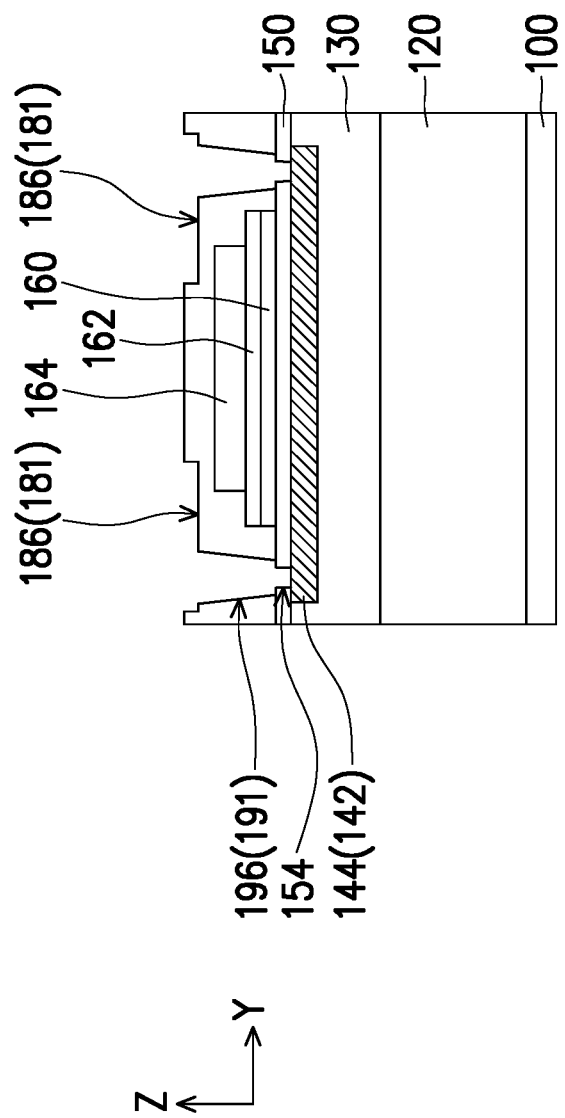
Figure 12A:
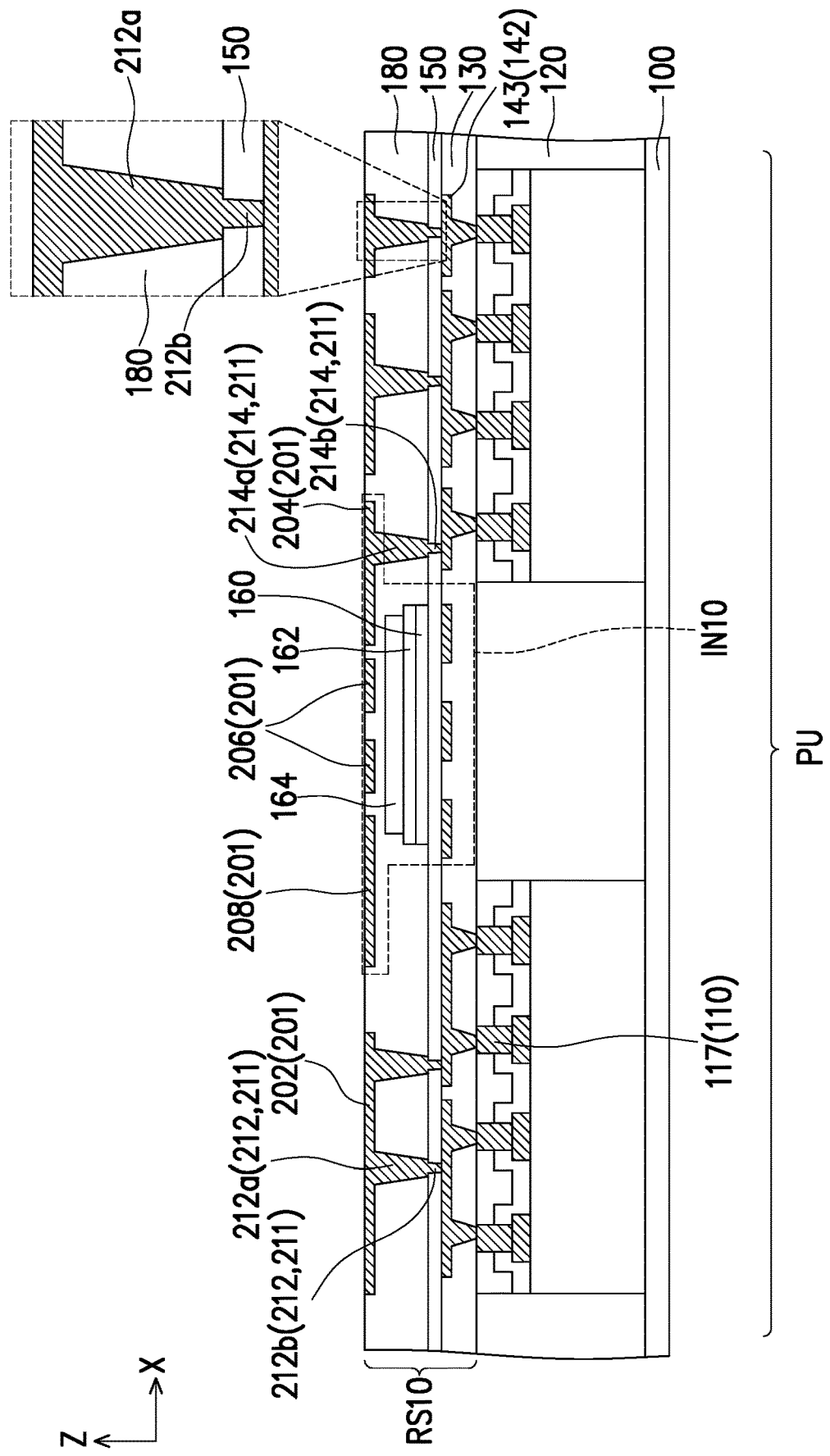
Figure 12B:
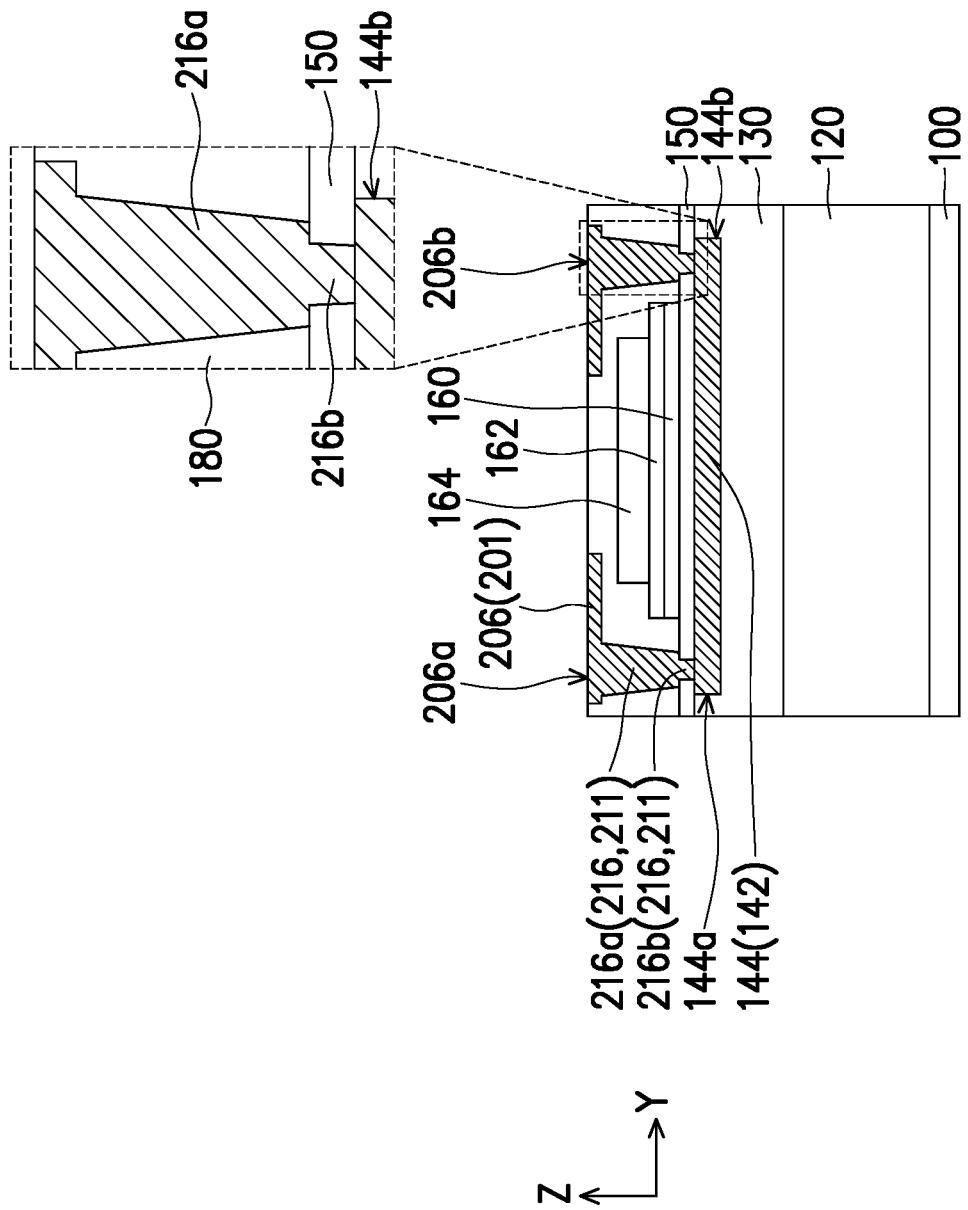

In FIG. 11A and FIG. 11B, a dielectric layer 180 is formed on the dielectric layer 150, embedding the buffer layer 160, the etch stop layer 162, and the core material layer 164. In some embodiments, the dielectric layer 180 includes trenches 181 and via openings 191. The trenches 181 are opened at the top surface 180t of the dielectric layer 180 and have elongated shapes in XY planes while extending along the Z direction for less than the total thickness of the dielectric layer 180. The trenches 181 may include routing trenches 182 and inductor trenches 184, 186, 188. The via openings 191 include routing via openings 192 and inductor via openings 194, 196. The routing trenches 182 are connected by at least one routing via opening 192 to the via openings 152 exposing the routing traces 143 at their bottom. The inductor trenches 184, 186, 188 include inductor terminal trenches 184, 188 and inductor spiral trenches 186. In some embodiments, the inductor terminal trenches 184, 188 are connected at one end to a corresponding one inductor spiral trace 144 by the inductor spiral via openings 196. One or both of the inductor terminal trenches 184, 188 may be connected at an opposite end to an inductor contact via opening 194. The inductor contact via opening 194 is, in turn, connected to a via opening 152 exposing a routing pattern 143 at its bottom. In some embodiments, the via openings 191 have larger footprints than the associated via openings 152, 154, so that the via openings 152, 154 appear to protrude from the bottom of the via openings 191.

In some embodiments, the inductor terminal trenches 184, 188 may have a bent shape in the XY plane, but the disclosure is not limited thereto. The inductor spiral trenches 186 are connected at opposite ends to the via openings 154 by the inductor spiral via openings 196. At the bottom of the via openings 154 are exposed the inductor spiral traces 144. The inductor spiral trenches 186 may be formed as trenches of similar length running substantially parallel to each other along a direction (e.g., a third direction) different than an extending direction of the inductor spiral traces 144, and disposed at a distance from each other along the same distribution direction of the inductor spiral traces 144 (e.g., the X direction). In some embodiments, the inductor spiral trenches 186 extend from an inductor spiral via opening 196 overlying an inductor spiral trace 144 to another inductor spiral via opening 196 overlying another inductor spiral trace 144, where the two inductor spiral via openings 196 connected to the same inductor spiral trench 186 are located at opposite sides with respect to the core material layer 164. Materials and processes to form the dielectric layer 180 may be similar to what was previously discussed for the dielectric layer 130. In some embodiments, the uncured dielectric material of the dielectric layer 180 may initially fill the via openings 152, 154. The dielectric layer 180 may then be patterned (e.g., by a sequence of exposure and development steps) to form the trenches 181 and the via openings 191. During the development step, the uncured material filling the via openings 152, 154 may be selectively removed with respect to the cured material of the dielectric layer 150. After the trenches 181 and the via openings 191 are formed, the material of the dielectric layer 180 may be thermally cured, to consolidate the pattern of the dielectric layer 180.

Referring to FIG. 11A, FIG. 11B, FIG. 12A, and FIG. 12B, in some embodiments, a conductive material is disposed in the trenches 181 and the via openings 191 to form conductive traces 201 and conductive vias 211, respectively. The conductive traces 201 include routing traces 202 formed in the routing trenches 182 and inductor traces 204, 206, 208 formed in the inductor trenches 184, 186, 188. The routing traces 202 are electrically connected to the routing traces 143 by the routing vias 212. The routing vias 212 may include a wider section 212a formed in correspondence of the routing via openings 192 and a narrower section 212b protruding from the wider section 212a and formed in correspondence of the via openings 152. The inductor traces 204, 206, 208 include inductor terminal traces 204, 208 formed in the inductor terminal trenches 184, 188, and inductor spiral traces 206 formed in the inductor spiral trenches 186. In some embodiments, the inductor terminal traces 204, 208 are connected at one end to an underlying inductor spiral trace 144 by the inductor spiral vias 216. The inductor spiral traces 206 are connected at opposite ends 206a, 206b to different inductor spiral traces 144 by inductor spiral vias 216. In some embodiments, a same inductor spiral trace 144 is connected to two different inductor spiral traces 206, and a same inductor spiral trace 206 is connected to two different inductor spiral traces 144. Therefore, in FIG. 12B, the illustrated portions of inductor spiral traces 206 contacting a same inductor spiral trace 144 belong to different inductor spiral traces 206. The inductor spiral vias 216 include a wider portion 216a formed in the inductor spiral via openings 196 and a narrower portion 216b protruding from the wider portion 216a formed in the via openings 154. In some embodiments, the other end of the inductor terminal traces 204, 208 may be connected to an inductor contact via 214 establishing electrical connection with the routing traces 143. The inductor contact via 214 includes a wider portion 214a formed in the inductor contact via opening 194 and a narrower portion 214b formed in the via opening 152. In some embodiments, the conductive material of the conductive traces 201 and the conductive vias 211 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by a plating process. The plating process may be, for example, electro-plating, electroless-plating, immersion plating, or the like. In some embodiments, the conductive material may be optionally deposited on a seed layer (not shown). In some embodiments, the inductor traces 144, 204, 206, 208, the inductor spiral vias 216, and the layers 150, 180, 160, 162, 164 disposed in between the inductor traces 144, 204, 206, 208, form an inductor IN10. In some embodiments, the inductor IN10 is a ferromagnetic-core inductor, including a conductive coil wrapped around a core region which include the core material layer 164. It should be noted that while in FIG. 13A and FIG. 13B the inductor terminal traces 204, 208 are illustrated as formed at the same level as the inductor spiral traces 206, the disclosure is not limited thereto. In some alternative embodiments, one or both of the inductor terminal traces 204, 208 may be formed at the level of the inductor spiral traces 144.

Figure 13A:
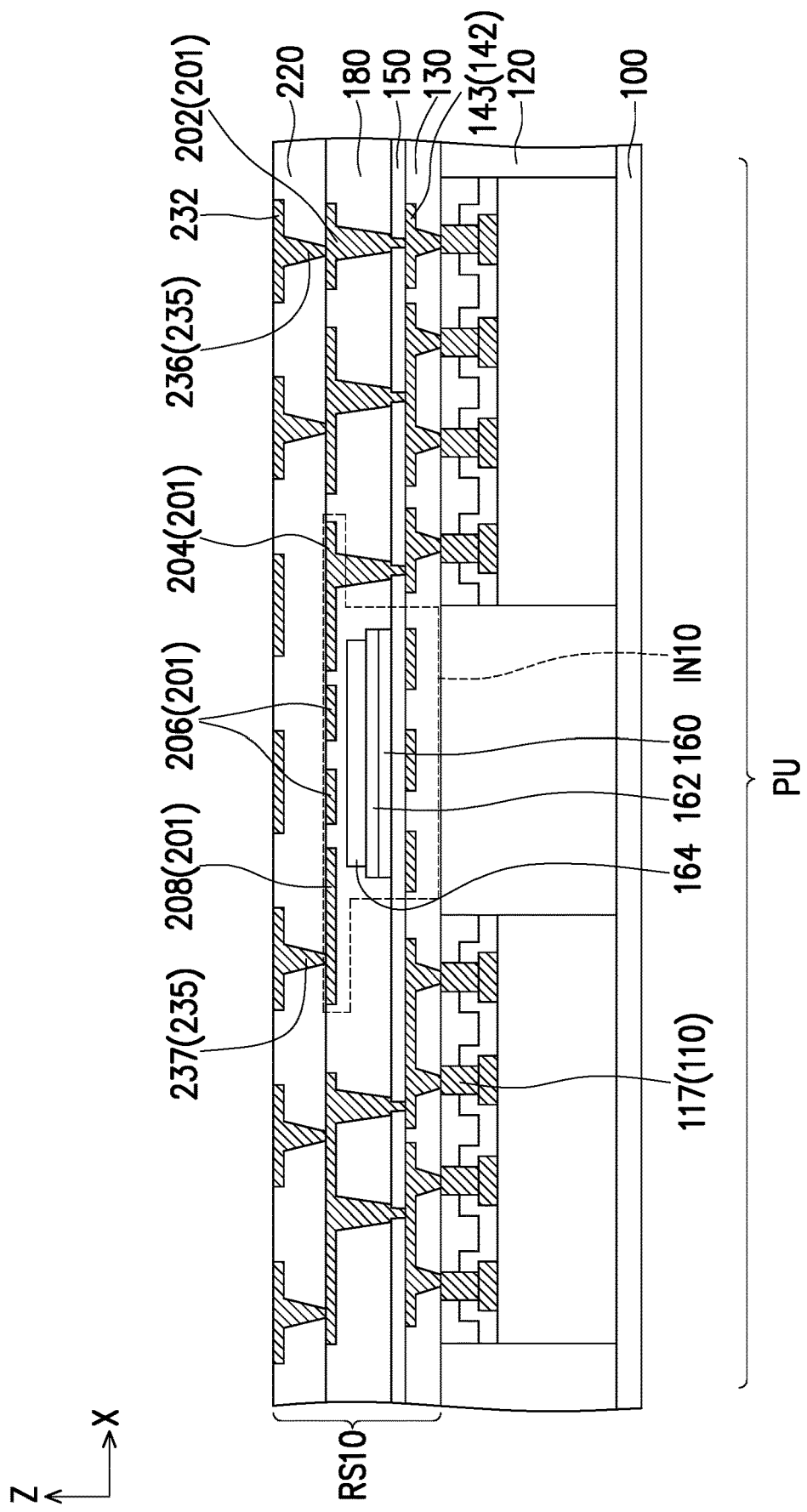
Figure 13B:
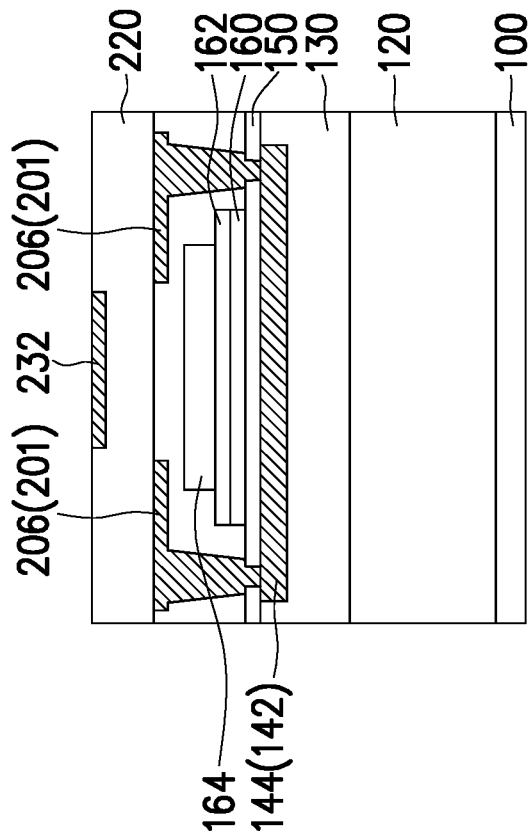

In FIG. 13A and FIG. 13B one or more additional tiers of the redistribution structure RS10 are formed over the tier including the inductor IN10, following similar processes as previously described. For example, a dielectric layer 220 is formed on the dielectric layer 180 and the conductive traces 201. Conductive (routing) traces 232 and conductive vias are formed to extend on and through the dielectric layer 220 to establish electrical contact with the routing traces 202 and, possibly, with one or both of the inductor terminal traces 204, 208, for example in case the inductor terminal traces 204, 208 were not already connected to the routing traces 143. For example, the routing traces 232 are connected to the routing traces 202 by routing vias 236, an, possibly, one of the routing traces 232 may be connected to the inductor terminal trace 208 by the inductor contact via 237. In some embodiments, each one of the inductor terminal traces 204, 208 is independently connected to one of the routing traces 143 or one of the routing traces 232. While in FIG. 13A the inductor terminal trace 204 is illustrated as connected to a routing trace 143 and the inductor terminal trace 208 is illustrated as connected to a routing trace 232, the disclosure is not limited thereto. For example, both inductor terminal traces 204, 208 may be connected to routing traces 232 or to routing traces 143, according to routing requirements. In some embodiments, the routing traces 232 may extend over the inductor spiral traces 206 without contacting them. That is, the inductor spiral traces 206 may be separated from the routing traces 232 by the dielectric layer 220, without conductive vias directly connecting the inductor spiral traces 206 to the routing traces 232.

Figure 14A:
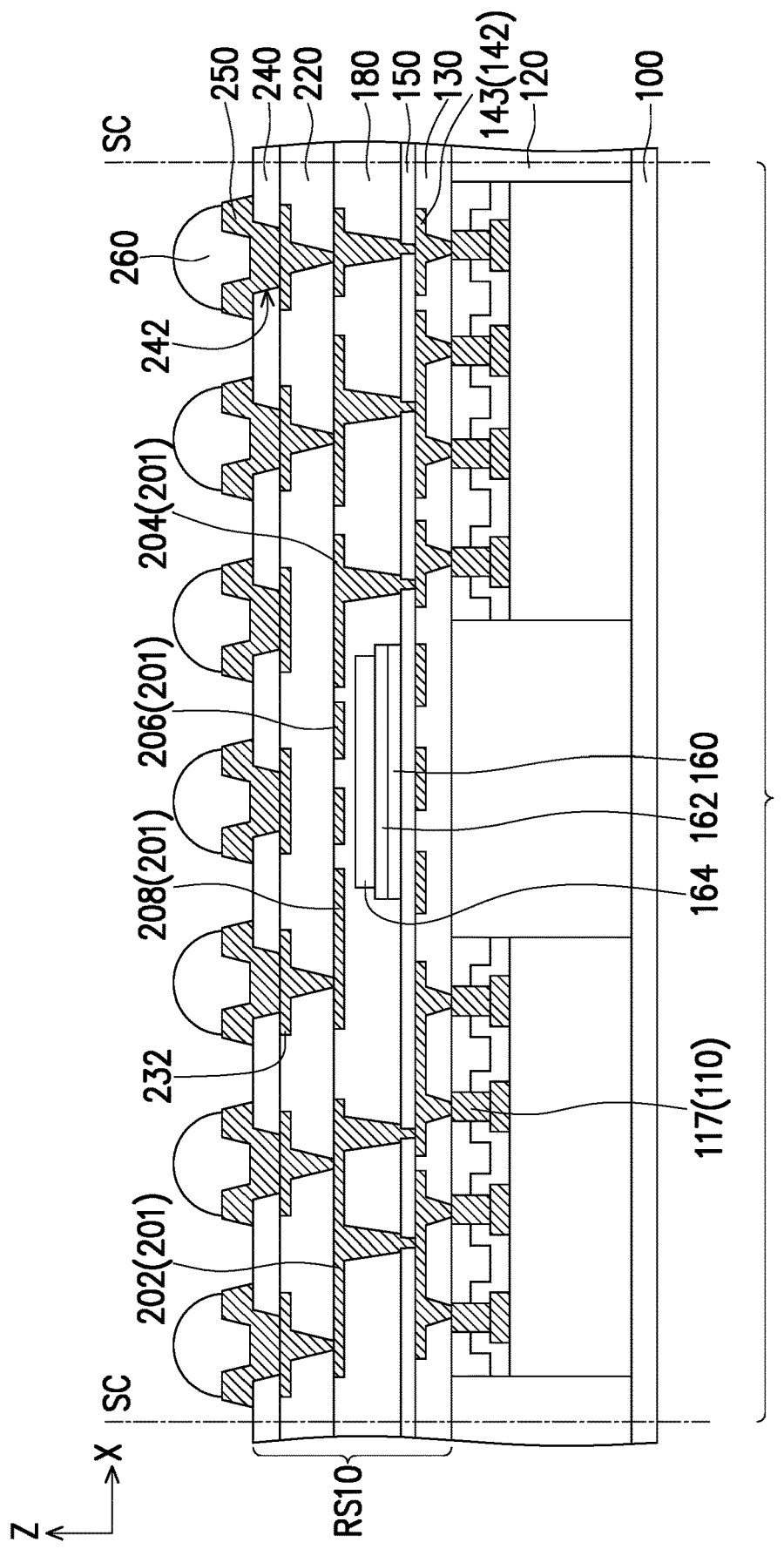
Figure 14B:
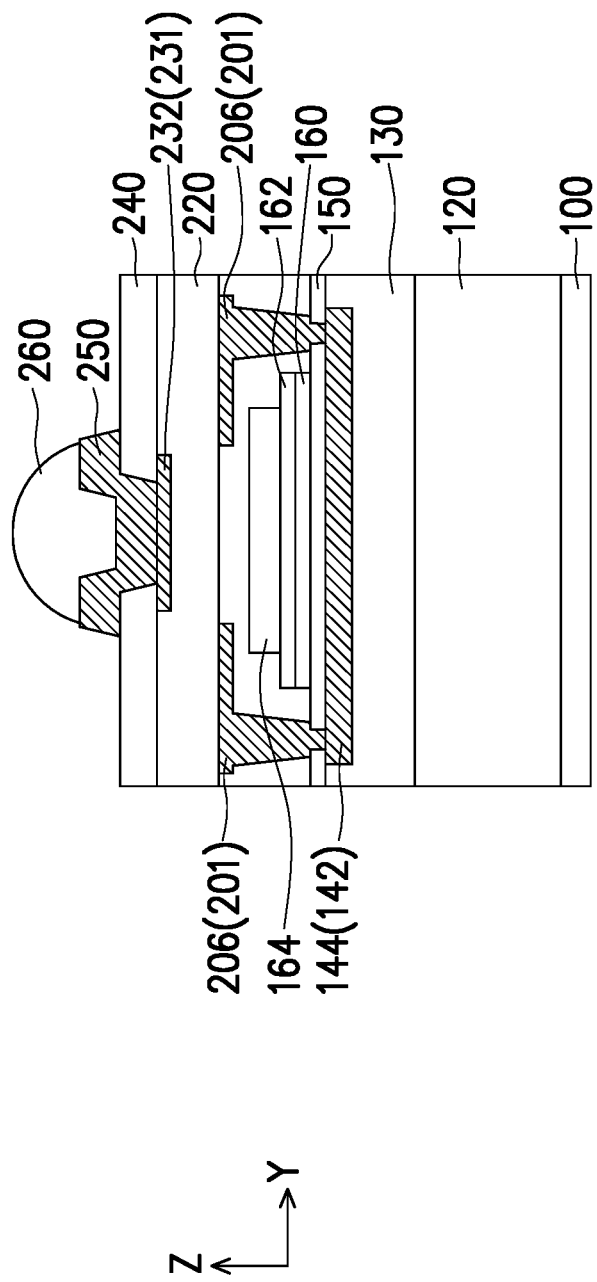

In FIG. 14A and FIG. 14B, a (topmost) dielectric layer 240 is formed on the dielectric layer 220 and the routing traces 232. The dielectric layer 240 includes openings 242 exposing portions of the routing traces 232. Materials and manufacturing methods of the dielectric layer 240 may be similar to the ones previously discussed with reference to the dielectric layer 130. In some embodiments, under-bump metallurgies 250 are optionally conformally formed in the openings 242 of the dielectric layer 240, in contact with the routing traces 232. In some embodiments, the under-bump metallurgies 250 may further extend over portions of the top surface of the dielectric layer 240 surrounding the openings 242. In some embodiments, the under-bump metallurgies 250 include multiple stacked layers of conductive materials. For example, the under-bump metallurgies 250 may include one or more metallic layers stacked on a seed layer. For example, the under-bump metallurgies may include copper, nickel, tin, or other suitable metallic materials.

Connective terminals 260 may be formed on the redistribution structure RS10. The connective terminals 260 may be formed on the under-bump metallurgies 250 (if included) or the exposed portions of the routing traces 232. In some embodiments, the connective terminals 600 are formed on the under-bump metallurgies 250, and are connected to the semiconductor die(s) 110 via the redistribution structure RS10. In some embodiments, the connective terminals 260 are attached to the under-bump metallurgies 250 through a solder flux. In some embodiments, the connective terminals 260 are controlled collapse chip connection (C4) bumps. In some embodiments, the connective terminals 260 include a conductive material with low resistivity, such as Sn, Pb, Ag, Cu, Ni, Bi, or an alloy thereof.

In some embodiments, referring to FIG. 14A, FIG. 14B, FIG. 15A, and FIG. 15B, a singulation step is performed to separate the individual package units PU in a plurality of semiconductor devices SD10, for example, by cutting along the scribe lanes SC arranged between individual package units PU. In some embodiments, the singulation process typically involves performing a wafer dicing process with a rotating blade and/or a laser beam. In some embodiments, the carrier 100 is separated from the semiconductor devices SD10 following singulation.

Figure 16:
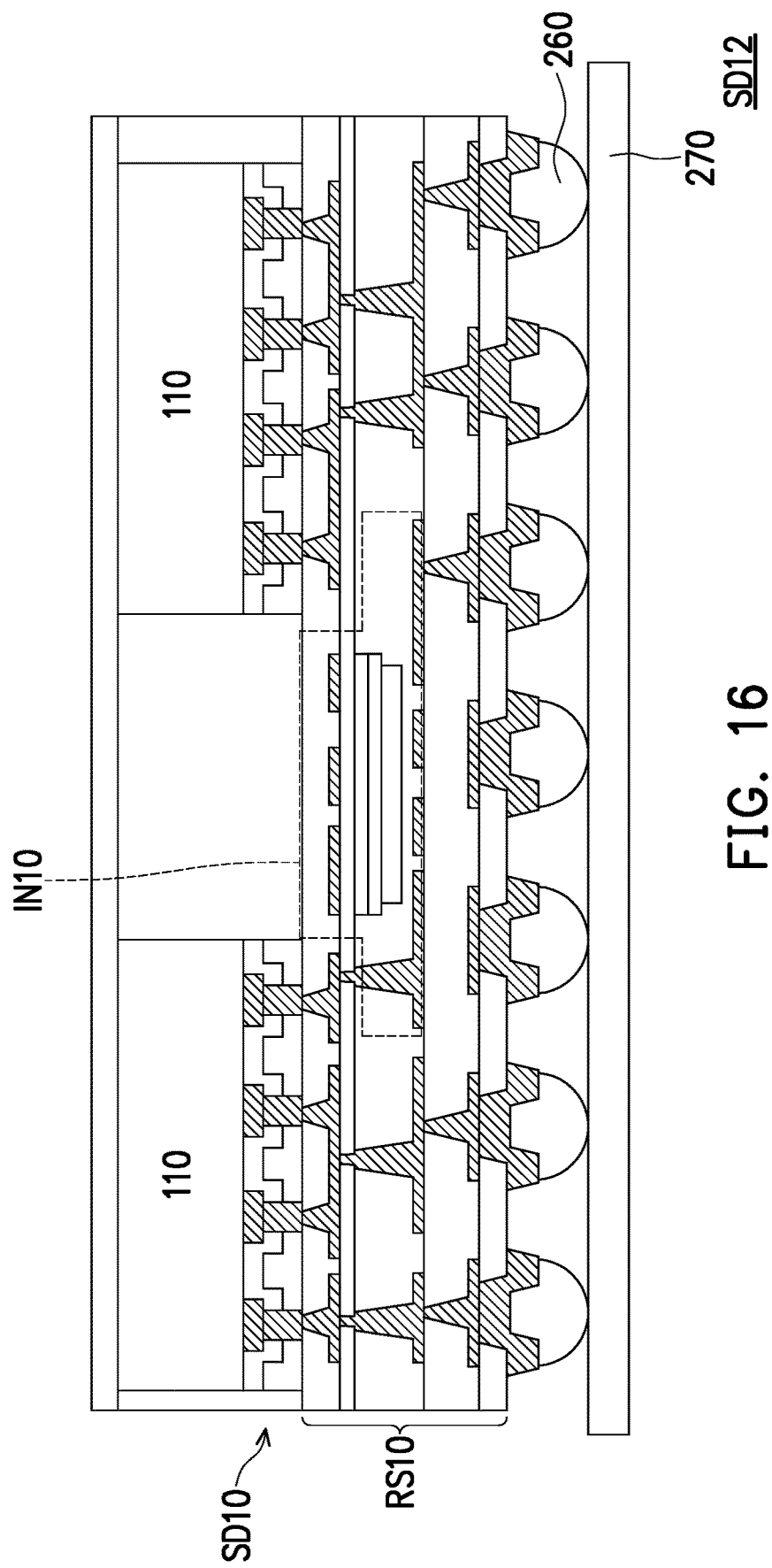
FIG. 16 is a schematic cross-sectional view of a semiconductor device according to some embodiments of the disclosure.

Based on the above, the semiconductor devices SD10 may be semiconductor packages including encapsulated semiconductor dies 110 and a redistribution structure RS10 formed on the encapsulated semiconductor dies 110. The redistribution structure RS10 includes dielectric layers 130, 150, 180, 220, 240 stacked on each other, conductive traces 142, 201, 232, extending on and in between the dielectric layers 130, 150, 180, 220, and conductive vias 146, 211, 235 extending through the dielectric layers 130, 150, 180, 220 to establish electrical connection between the conductive traces 142, 210, 232 and the semiconductor dies 110. Connective terminals 260 are formed on the redistribution structure RS10 to integrate the semiconductor device SD10 in larger devices. For example, as illustrated in FIG. 16, the semiconductor device SD10 may be disposed on a circuit substrate 270 and integrated into a larger semiconductor device SD12. The connective terminals 260 may establish electrical connection between the semiconductor device SD10 and the circuit substrate 270.

Figure 15A:
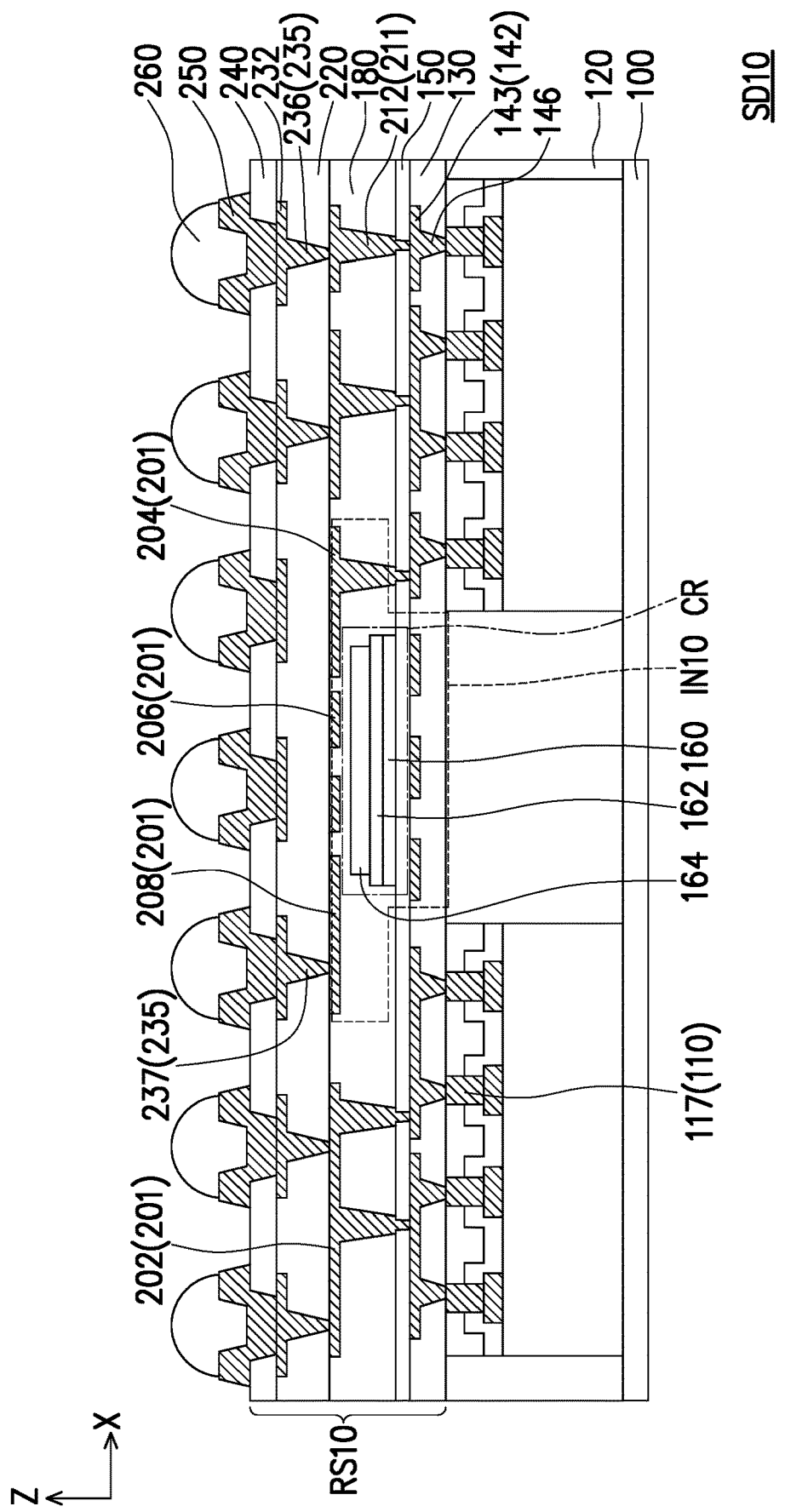
Figure 15B:
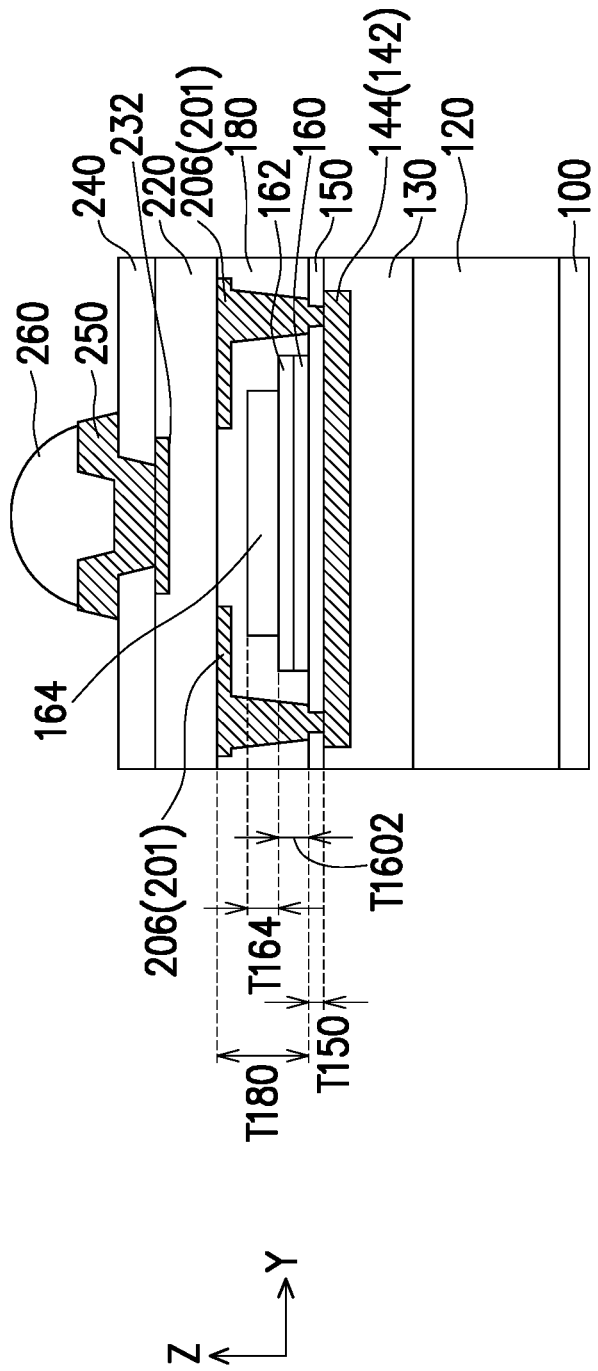
Figure 17A:
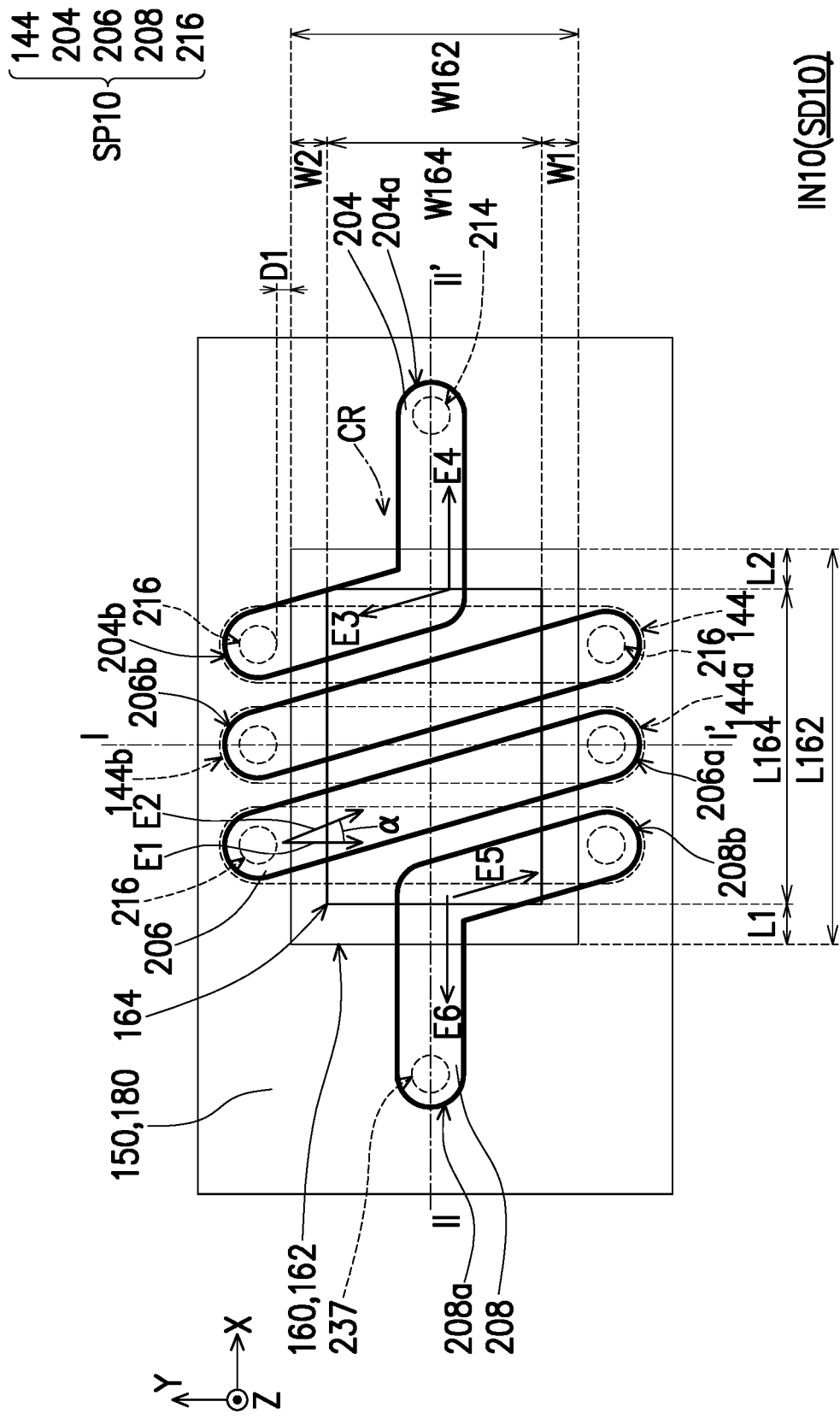
FIG. 17A and FIG. 17B are schematic top views of inductors according to some embodiments of the disclosure.

In the following, some aspects of the inductor IN10 according to some embodiments of the disclosure will be discussed with reference to FIG. 15A, FIG. 15B, and FIG. 17A. FIG. 17A is a schematic top view of the region of the semiconductor device SD10 including the inductor IN10 according to some embodiments of the disclosure. Some elements may have been omitted for clarity and simplicity. In some embodiments, the inductor IN10 includes a conductive spiral SP10 winding around a core CR. For example, adjacent inductor spiral traces 144, 206, may be sequentially and alternately connected by the inductor spiral vias 216 to form the coils of the conductive spiral SP10. In some embodiments, the inductor spiral traces 144 and 206 extend along different extending directions E1 and E2, respectively. For example, the inductor spiral traces 144 extend along the extending direction E1, which may be substantially parallel to the Y direction, and are disposed at a distance from each other (e.g., a pitch of the conductive spiral SP10) along the X direction. The inductor spiral traces 206 extend along an extending direction E2 which defines an angle α with respect to the extending direction E1 of the inductor spiral traces 144. In some embodiments, the angle α may be in a range from about 15 degrees to about 25 degrees. In some embodiments, the inductor spiral vias 216 connect with each other overlapping ends of the inductor spiral traces 144, 206. For example, the end 144a of an inductor spiral trace 144 overlaps with the end 206a of an inductor spiral trace 206, and is connected to the end 206a by the inductor spiral via 216. The end 144b of the same inductor spiral trace 144 overlaps with an end 206b of another inductor spiral trace 206, and is connected to the other inductor spiral trace 206 by another inductor spiral via 216. Similarly, an inductor spiral trace 206 is connected to different inductor spiral traces 144 at the two ends 206a, 206b. The inductor terminal traces 204, 208 constitute opposite terminals of the conductive spiral SP10. Each inductor terminal trace 204, 208 may include a first segment extending along an extending direction E3, E5 substantially parallel to the extending direction of the inductor spiral traces formed on the same level. For example, as the inductor terminal traces 204, 208 are formed on the level of the inductor spiral traces 206, the extending directions E3 and E5 may be both parallel to the extending direction E2. Each inductor terminal trace 204, 208 may further include a second segment extending along an extending direction E4, E6 different from the extending directions E3, E5. At the ends 204a, 208a of the second segments, the inductor terminal traces 204, 208 are contacted by inductor contact vias 214, 237 to integrate the inductor IN10 into larger circuits. The ends 204b, 208b of the first segments, instead, are connected to inductor spiral vias 216 to connect the inductor terminal traces 204, 208 to the outermost inductor spiral traces 144 (the inductor spiral traces formed at a different level than the inductor terminal traces 204, 208).

The conductive spiral SP10 is wound around the core CR of the inductor IN10. In some embodiments, the core CR10 includes the core material layer 164 including a ferromagnetic material. That is, the inductor IN10 is a ferromagnetic-core inductor IN10. In some embodiments, the core CR10 further comprises the buffer layer 160 and the etch stop layer 162 stacked between the core material layer 164 and the dielectric layer 150. In some embodiments, the buffer layer 160, the etch stop layer 162, and the core material layer 164 occupy only a portion of the dielectric layer 150. That is, the span of the dielectric layer 150 is larger than the footprints of the buffer layer 160, the etch stop layer 162, and the core material layer 164. Portions of the dielectric layer 180 may be disposed at an opposite side of the core material layer 164 with respect to the buffer layer 160 to separate the core material layer 164 from the inductor spiral traces 206. The dielectric layer 180 further separates the side surfaces (e.g., edges) of the core material layer 164, the buffer layer 160 and the etch stop layer 162 from the inductor spiral vias 216. As illustrated in FIG. 17A, when viewed from the top (e.g., along the Z direction), the buffer layer 160 and the etch stop layer 162 laterally protrude with respect to the core material layer 164. That is, the footprints of the buffer layer 160 and the etch stop layer 162 are larger than the footprints of the core material layer 164. In some embodiments, the buffer layer 160 and the etch stop layer 162 have substantially the same footprint with respect to each other. In some embodiments, a projection of the core material layer 164 along a stacking direction of the core material layer 164 and the buffer layer 160 (e.g., the Z direction) is fully contained within the footprint of the buffer layer 160. That is, the edges of the core material layer 164 are vertically misaligned with respect to the edges of the etch stop layer 162 and the buffer layer 160. In some embodiments, by misaligning the edges of the etch stop layer 162 with respect to the edges of the core material layer 164, mechanical stress which may be generated at the interface of the core material layer 164 and the dielectric layer 180 because of the rigidity (or hardness) of the core material layer 164 may be effectively dissipated, thus reducing or even preventing cracking at the interface with the dielectric layers 150 and/or 180. That is, by structuring the core CR of the inductor IN10 with an etch stop layer 162 and a buffer layer 160 larger than the core material layer 164, the manufacturing yield and the reliability of the semiconductor device SD10 may increase. In some embodiments, the buffer layer 160, the etch stop layer 162, and the core material layer 164 occupy only a portion of the dielectric layer 150.

In some embodiments, the core material layer 164 and the etch stop layer 162 with the buffer layer 160 may respectively have lengths L164 and L162 along the separation direction (e.g., the X direction) of the inductor spiral traces 144 and 206. In some embodiments, the length L162 of the etch stop layer 162 (and the buffer layer 160) is greater than the length L164 of the core material layer 164. For example, the length L162 may be 0.25% to 6% larger than the length L164. In some embodiments, protruding lengths L1 and L2 of the etch stop layer 162 (and the buffer layer 160) along the separation direction of the inductor spiral traces 144, 206 with respect to the core material layer 164 may independently be 0.125% to 3% of the length L164 of the core material layer 164. For example, the length L164 may be in the range from 1 mm to 2.4 mm, and the lengths L1 and L2 may independently be in the range from 3 micrometers to 30 micrometers. Similarly, the core material layer 164 and the etch stop layer 162 with the buffer layer 160 may respectively have widths W164 and W162 along a direction (e.g., the Y direction) perpendicular to the separation direction (e.g., the X direction) of the inductor spiral traces 144 and 206. In some embodiments, the width W162 of the etch stop layer 162 (and the buffer layer 160) is greater than the width W164 of the core material layer 164. For example, the width W162 may be 1% to 30% larger than the width W164. In some embodiments, protruding widths W1 and W2 of the etch stop layer 162 (and the buffer layer 160) along the direction perpendicular to separation direction of the inductor spiral traces 144, 206 with respect to the core material layer 164 may independently be 0.5% to 15% of the width W164 of the core material layer 164. For example, the width W164 may be in the range from 200 micrometers to 600 micrometers, and the protruding widths W1 and W2 may independently be in the range from 3 micrometers to 30 micrometers. In some embodiments, a distance D1 between the edge of the etch stop layer 162 and the buffer layer 160 and the facing edge of the inductor spiral vias 216 may be between 0.33% to 10% of the width W164. For example, the distance D1 may be greater than about two micrometers. In some cases, the distance D1 may be in the range from about 2 micrometers to about 20 micrometers, but the disclosure is not limited thereto. In some embodiments, the distance D1 is measured along a same direction as the widths W162 and W164.

In some embodiments, the buffer layer 160 may be separated from the inductor spiral traces 144 by the dielectric layer 150. In some embodiments, the thickness T150 of the dielectric layer 150 along the stacking direction of the layers 160, 162, 164 (e.g., the Z direction) may be about 90% to 270% of the thickness T164 of the core material layer 164. In some embodiments, the core material layer 164 may be thicker than the etch stop layer 162 and the buffer layer 160 along. For example, the combined thickness T1602 of the etch stop layer 162 and the buffer layer 160 may be about 5% to 66% of the thickness T164 of the core material layer 164. For example, the thickness T164 of the core material layer 164 may be in the range from 4.5 to 5.5 micrometers, the combined thickness T1602 of the buffer layer 160 and the etch stop layer 162 may be in the range from 0.3 micrometers to 3 micrometers, and the thickness T150 of the dielectric layer may be in the range from 5 micrometers to 12 micrometers. However, the disclosure is not limited thereto, and other dimensions may be possible according to production requirements.

Figure 17B:
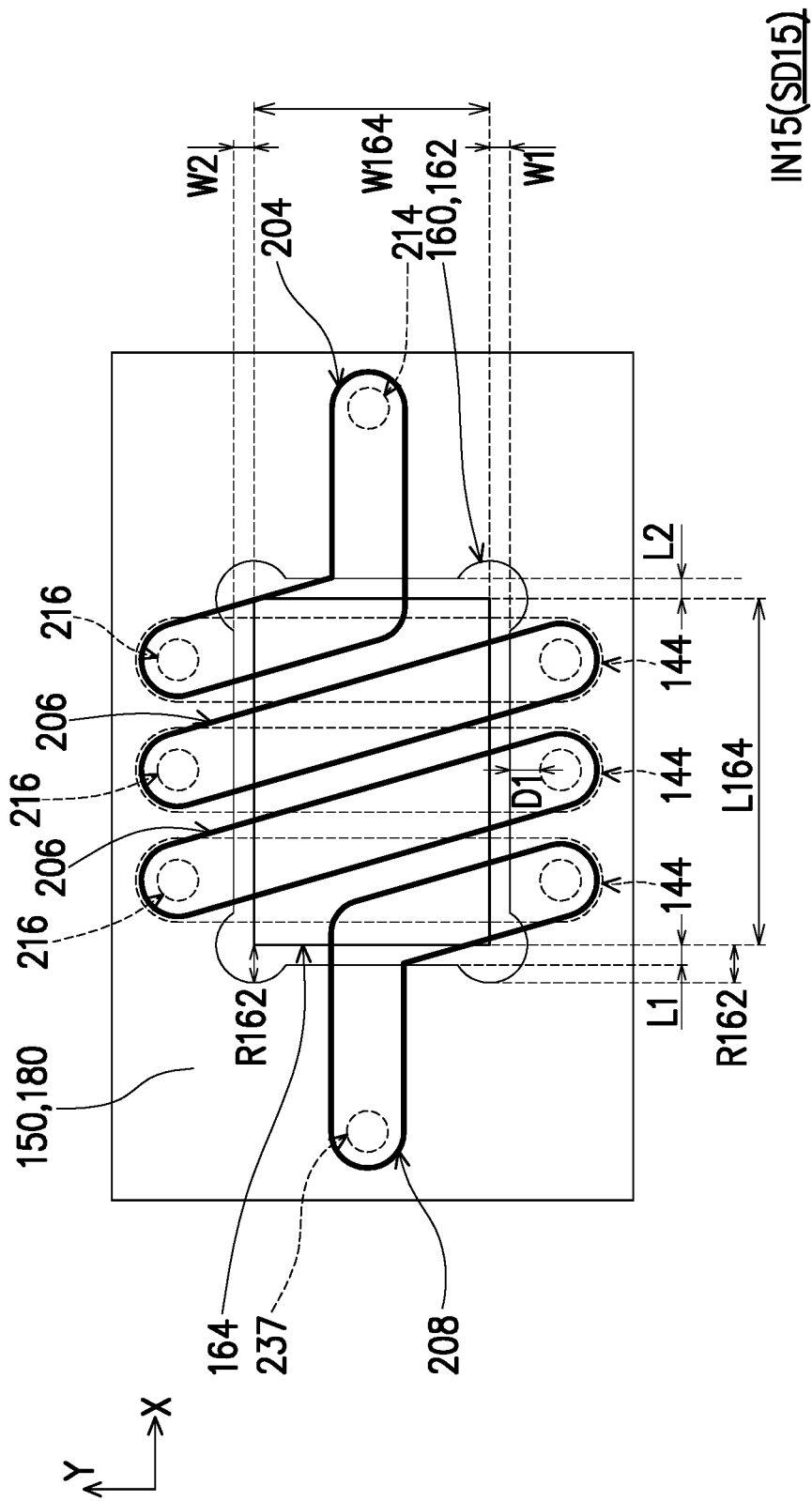

FIG. 17B is a schematic top view of an inductor IN15 of a semiconductor device SD15 according to some embodiments of the disclosure. The semiconductor device SD15 may have a similar structure and be manufactured according to similar processes as previously discussed for the semiconductor device SD10 of FIG. 15A. In some embodiments, a difference between the inductor IN10 of FIG. 17A and the inductor IN15 of FIG. 17B lies in the shape of the footprint of the etch stop layer 162 and the buffer layer 160. That is, in the inductor IN15, the etch stop layer 162 and the buffer layer 160 present protruding edges in correspondence of the corners of the core material layer 164. For example, the footprint of the etch stop layer 162 and the buffer layer 160 may be approximately described as rectangular, with circular protrusions of radius R162 in correspondence of the corners of the core material layer 164, where the radius R162 is measured taking as a center of the circle the corner of the core material layer 164. In some embodiments, the radius R162 may be from about 0.125% to about 3% of the length L164. In some embodiments, the radius R162 may be from about 0.5% to about 15% of the width W164. For example, the radius R162 may be in the range from 3 micrometers to 30 micrometers, but the disclosure is not limited thereto. In some embodiments, the etch stop layer 162 and the buffer layer 160 may protrude with respect to the core material layer 164 only in correspondence of the corners of the core material layer 164. That is, the protruding lengths L1, L2, and/or the protruding widths W1, W2 measured in correspondence of the straight edges (rather than the round corners) of the layers 160, 162 could be as small as 0% of the length L164 or the width W164 of the core material layer 164. For example, the protruding lengths L1, L2 may independently be in the range from 0% to 3% of the length L164, and the protruding widths W1, W2 may independently be in the range from 0% to 15% of the width W164. In some embodiments, the length L164 may be in the range from 1 mm to 2.4 mm, the width W164 may be in the range from 200 micrometers to 600 micrometers, and the distance D1 between the straight edge portions of the etch stop layer 162 and the inductor spiral vias 216 may be greater than 2 micrometers. Other aspects of the semiconductor device SD15 may be the same as previously described for the semiconductor device SD10.

Figure 18:
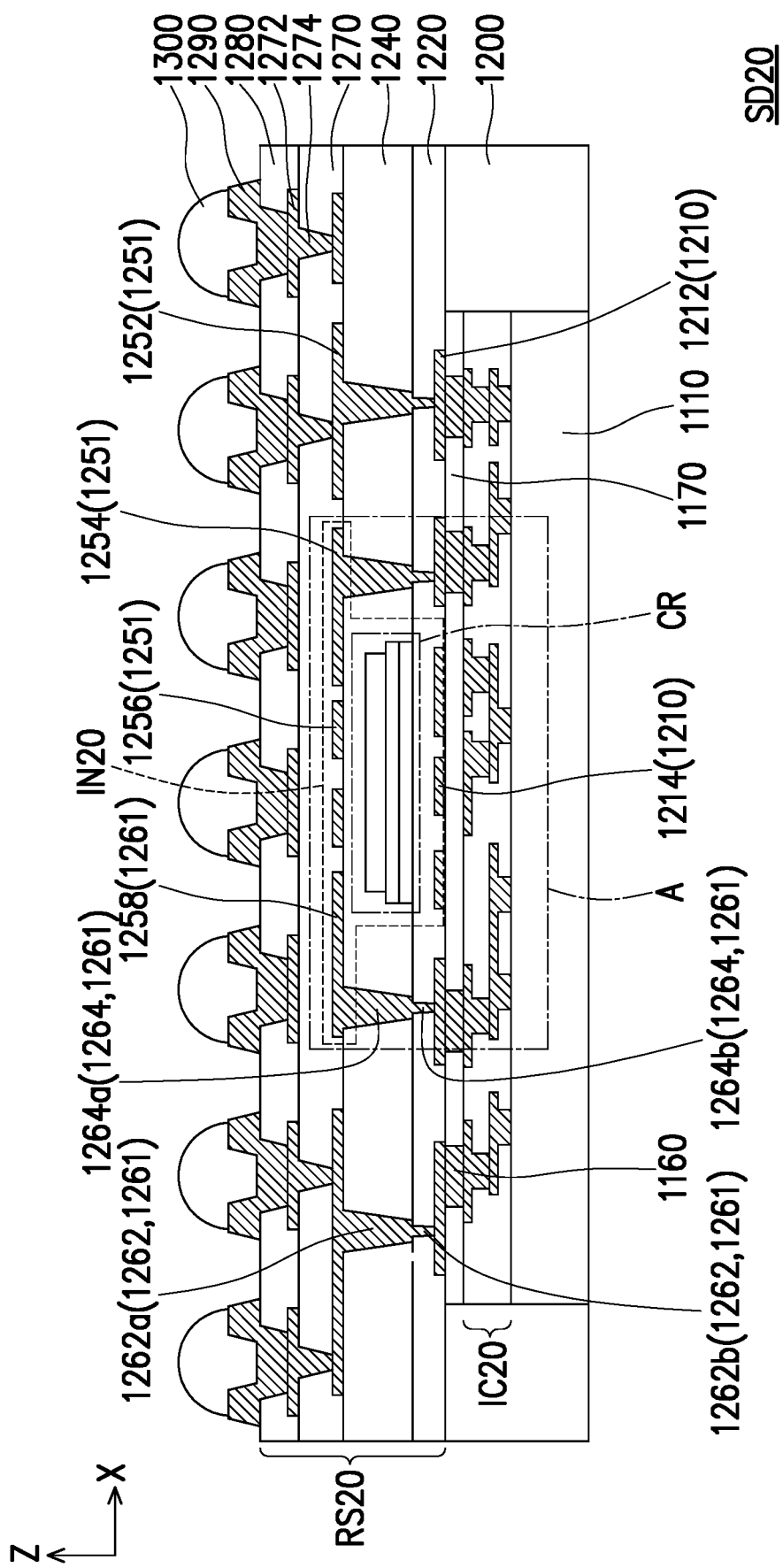
FIG. 18 is a schematic cross-sectional view of a semiconductor device according to some embodiments of the disclosure.
Figure 19A:
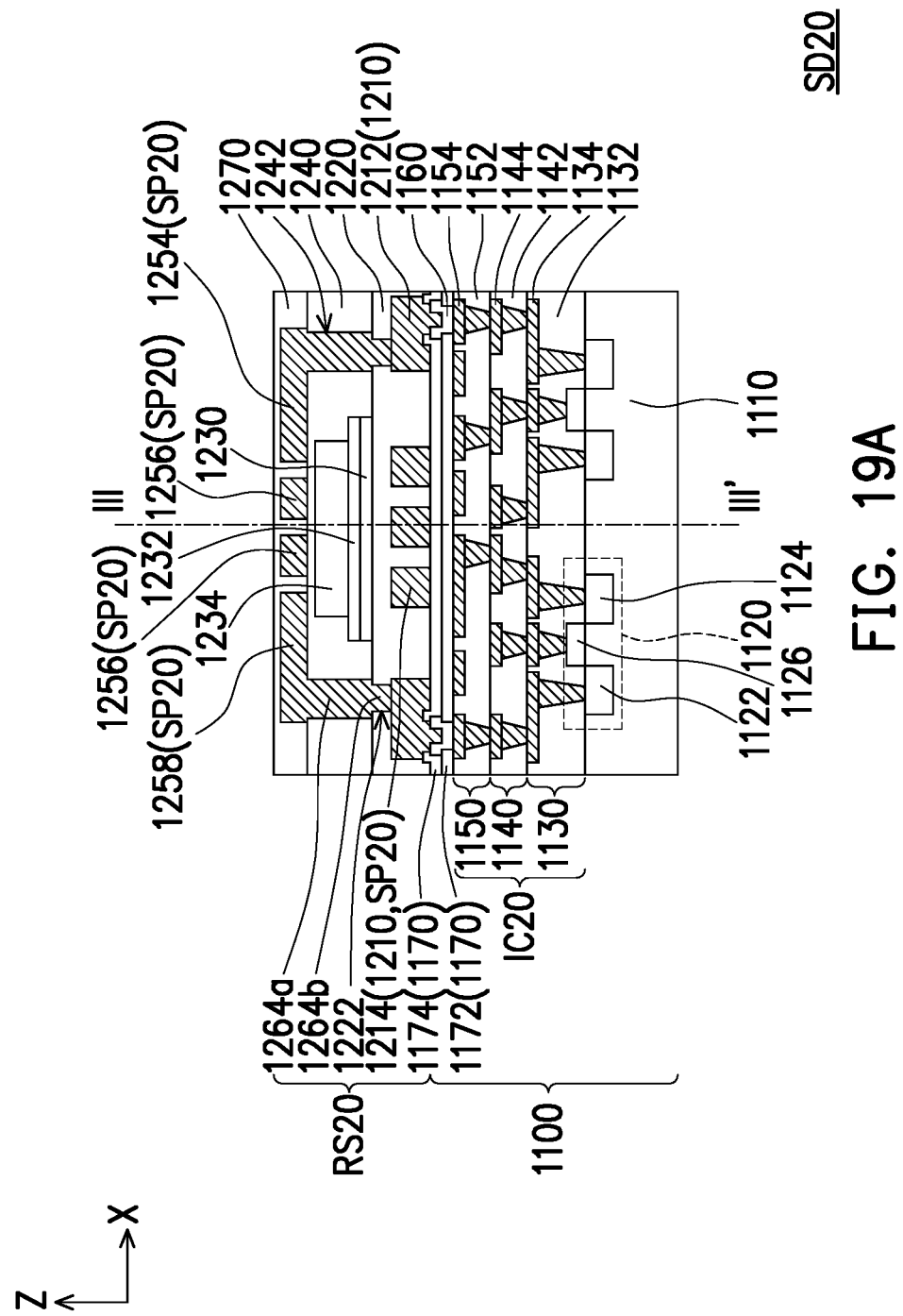
FIG. 19A and FIG. 19B are schematic cross-sectional views of the structure of FIG. 18 according to some embodiments of the disclosure.
Figure 19B:
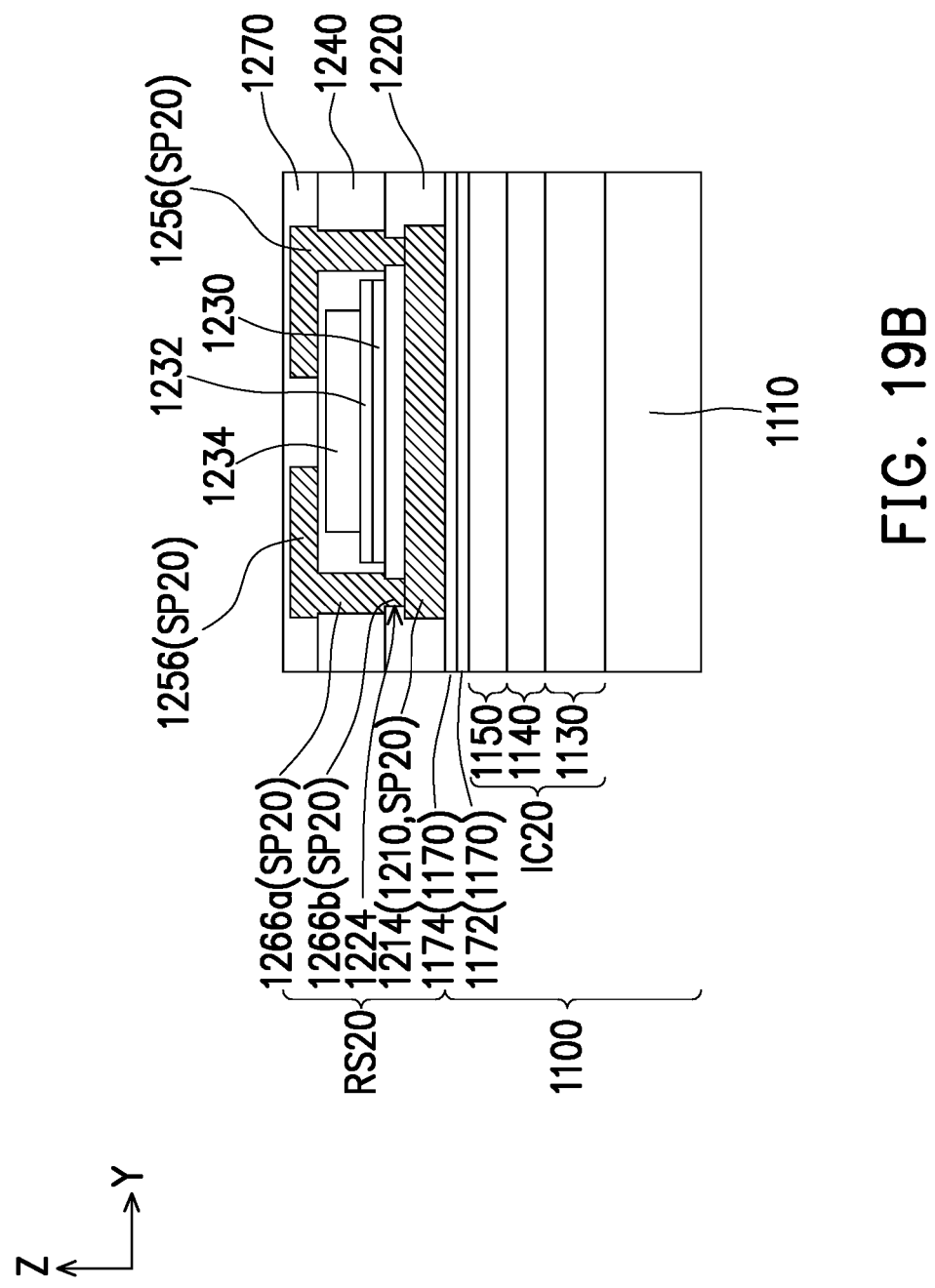

FIG. 18 is a schematic cross-sectional view of a semiconductor device SD20 according to some embodiments of the disclosure. FIG. 19A and FIG. 19B are schematic cross-sectional views of regions of the semiconductor device SD20 according to some embodiments of the disclosure. In FIG. 19A is illustrated an enlarged view of the area A of FIG. 18. FIG. 19 corresponds to a cross-sectional view of the structure of FIG. 19A taken at the level height of the line III-III' of FIG. 19A. Briefly, the semiconductor device SD20 may include one or more semiconductor dies 1100 encapsulated in an encapsulant 1200. The semiconductor die 1100 may have a similar structure with respect to the semiconductor dies 110 previously described. In the following, some details of the semiconductor die(s) 1100 which may also apply to the semiconductor dies 110 will be described with reference to FIG. 19A and FIG. 19B. For example, a semiconductor die 1100 may include a semiconductor substrate 1110 and circuit devices (e.g., the transistors 1120) formed on the semiconductor substrate 1110. A transistor 1120 may include a pair of source and drain regions 1122, 1124 and a gate structure 1126. An interconnection structure IC20 may be formed over the semiconductor substrate 1110, to integrate the circuit devices such as the transistors 1120 in larger functional circuits. The interconnection structure IC30 may include one or more interconnection tiers 1130, 1140, 1150, stacked over the semiconductor substrate 1110. Each interconnection tier 1130, 1140, 1150 may include a dielectric layer 1132, 1142, 1152, and conductive patterns 1134, 1144, 1154 extending on and through the dielectric layers 1132, 1142, 1152 to integrate the circuit devices (e.g., the transistors 1120) formed on the semiconductor substrate 1110 in functional circuits. Contact pads 1160 may be formed on some of the uppermost conductive patterns 1154, similar to the contact pads 113 of FIG. 1A, for example. A passivation layer 1170 may extend on the interconnection structure IC20 to protect the interconnection structure IC20. The passivation layer 1170 may have a composite structure, including multiple layers 1172, 1174, for example. The passivation layer 1170 may surround the contact pads 1160, and even partially cover the top surfaces of the contact pads 1160. The passivation layer 1170, however, includes opening exposing at least portions of the contact pads 1160.

Referring to FIG. 18A, FIG. 19A and FIG. 19B, a redistribution structure RS20 is disposed on the encapsulated semiconductor die(s) 1100. The redistribution structure RS20 may have a similar structure and include similar materials as the redistribution structure RS10 (illustrated, e.g., in FIG. 15A). Briefly, the redistribution structure RS20 may include conductive traces 1210, 1251, 1272 alternately stacked with dielectric layers 1220, 1240, 1270, 1280, and interconnected to each other and to the semiconductor die(s) 1100 by conductive vias 1261, 1274. Under-bump metallurgies 1290 may be optionally formed on the uppermost conductive traces 1272, and connective terminals 1300 may be provided to allow integration within larger devices. The conductive traces 1210, 1251, 1272 may include routing traces 1212, 1252, 1272 and inductor traces 1214, 1254, 1256, 1258. Similarly, the conductive vias 1261, 1274 may include routing vias 1274, 1262, inductor contact vias 1264, and inductor spiral vias 1266. That is, in some embodiments, an inductor IN20 is formed within the redistribution structure RS20. The inductor IN20 may have a structure similar to the inductor IN10 of FIG. 17A or the inductor IN15 of FIG. 17B, for example. In some embodiments, the conductive spiral SP20 of the inductor IN20 may be wound around a core CR including a core material layer 1234. The core material layer 1234 may be disposed between the dielectric layers 1220, 1240. The dielectric layer 1240 may cover the core material layer 1234 and separate the core material layer 1234 from the inductor traces 1254, 1256, 1258. A buffer layer 1230 and an etch stop layer 1232 are sequentially stacked on the dielectric layer 1220 to separate the core material layer 1234 from the dielectric layer 1220. In some embodiments, the buffer layer 1230 and the etch stop layer 1232 laterally protrude with respect to the core material layer 1234, similarly to what was previously discussed with reference to FIG. 17A and FIG. 17B for the inductors IN10 and IN15. A difference with respect to the semiconductor devices SD10 and/or SD20 lies in that the inductor IN20 is formed directly on the passivation layer 1170 of the semiconductor die 1100. For example, the inductor spiral traces 1214 are formed on the passivation layer 1170. In some embodiments, the inductor terminal traces 1254, 1258 are connected to two contact pads 1260 of a same semiconductor die 1100.

Figure 20A:
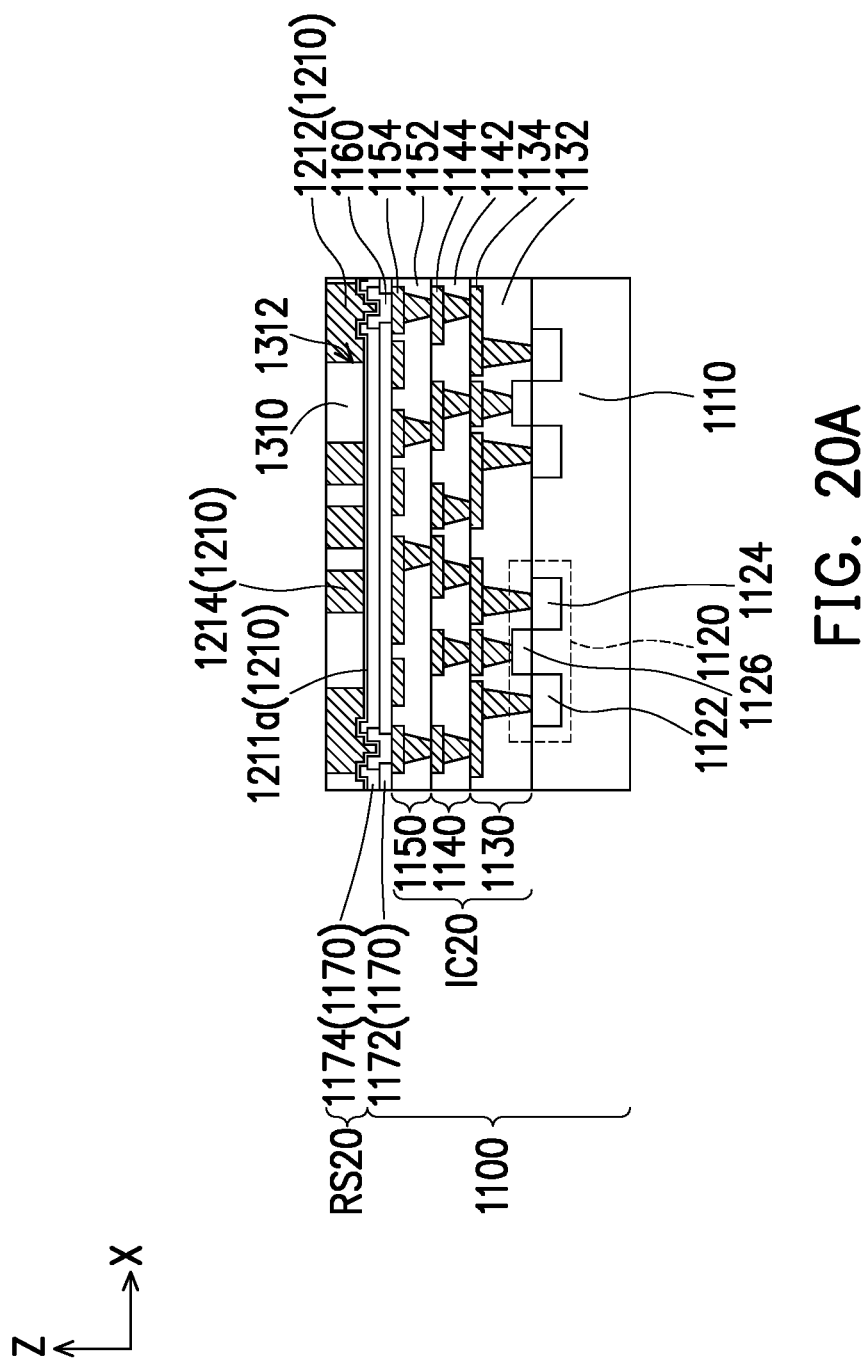
FIG. 20A to FIG. 20F are schematic cross-sectional views of structures produced during a manufacturing method of a semiconductor device according to some embodiments of the disclosure.
Figure 20B:
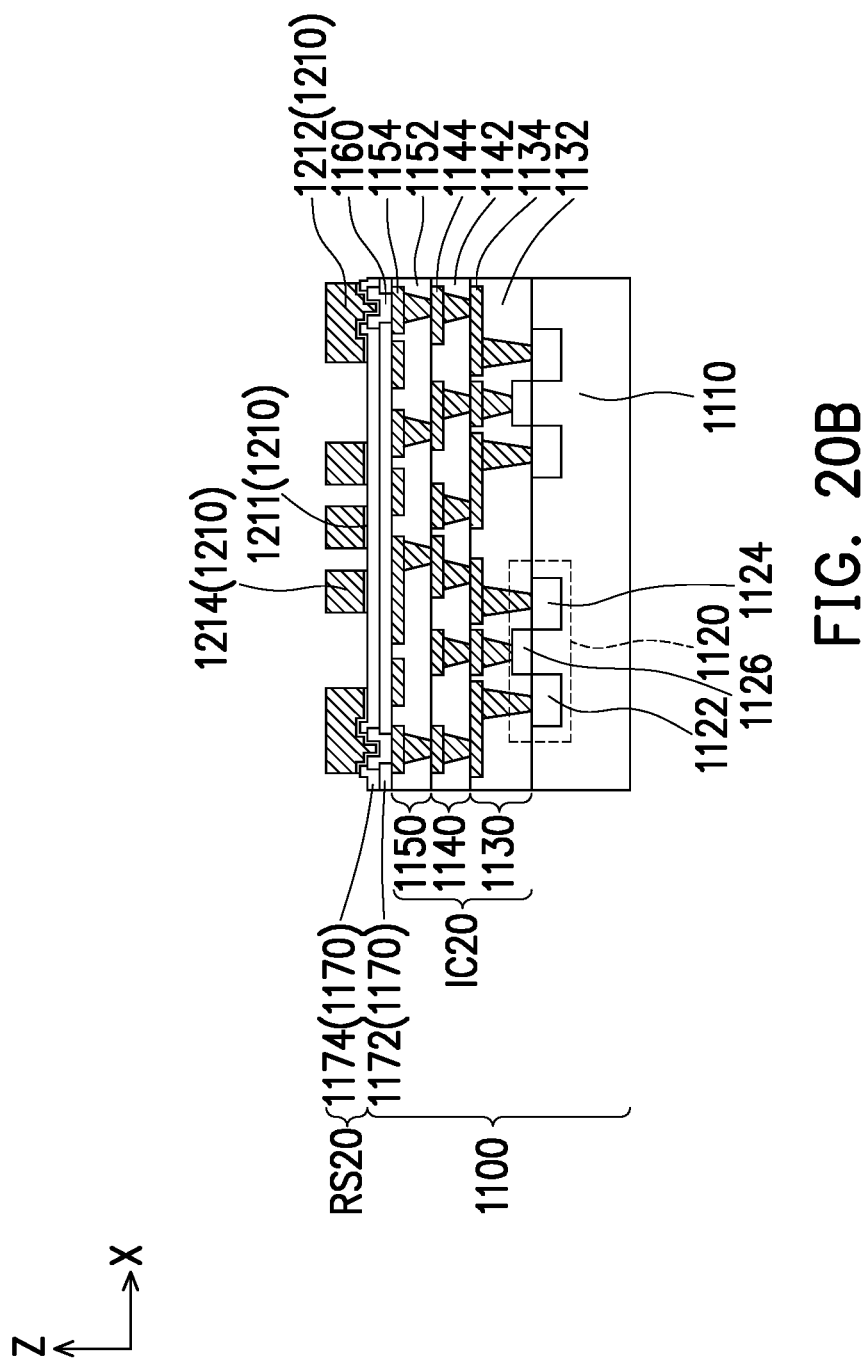

In FIG. 20A to FIG. 20F are illustrated some structures formed during manufacturing of the semiconductor device SD20 according to some embodiments of the disclosure. FIG. 20A to FIG. 20F illustrate the same area as FIG. 19A. In FIG. 20A, a seed material layer 1211a may be blanketly formed on the encapsulated semiconductor die 1100 before forming the patterned auxiliary mask 1310. The seed material layer 1211a may be formed through, for example, a sputtering process, a physical vapor deposition (PVD) process, or the like. In some embodiments, the seed material layer 1211a may include, for example, copper, tantalum, titanium, a combination thereof, or other suitable materials. In some embodiments, additional layers (not shown) such as a barrier layer and/or a liner layer may be deposited before forming the seed material layer 1211a to prevent out-diffusion of the material of the seed material layer 1211a. A patterned auxiliary mask 1310 is then formed on the seed material layer 1211a. The auxiliary mask 1310 includes openings 1312 defining the positions of the conductive traces 1210. The auxiliary mask 1310 may include similar materials and be formed following similar processes as previously described for the auxiliary mask 170 (illustrated, e.g., in FIG. 7A). The conductive traces 1210 are then formed by disposing a conductive material in the openings of a patterned auxiliary mask 1310. The auxiliary mask 1310 and the underlying portions of seed material layer 1211a may be removed, to leave the routing traces 1212 and the inductor spiral traces 1214 with underlying seed layers 1211, as illustrated, e.g. in FIG. 20B. In the following, the seed layers 1211 may be omitted from the drawings. In the structure illustrated in FIG. 20B, the inductor spiral traces 1214 may be electrically floating, while the routing traces 1212 are formed on the contact pads 1160 of the semiconductor die(s) 1100.

Figure 20C:
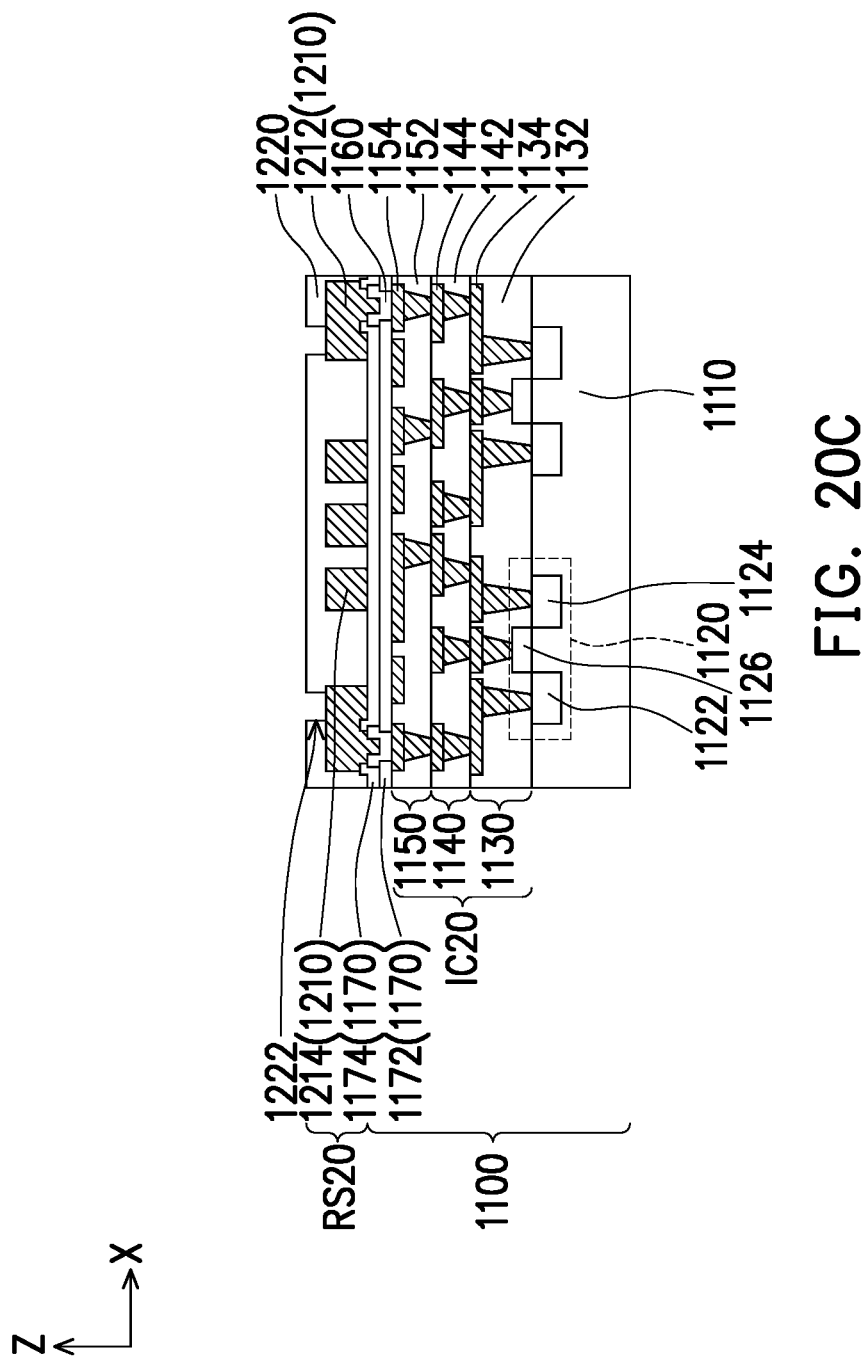

In FIG. 20C, the dielectric layer 1220 is formed on the encapsulated semiconductor die 1100 to partially cover the conductive traces 1210. Bottom surfaces of the conductive traces 1210 may be substantially coplanar (along the Z direction) with the bottom surface of the dielectric layer 1220. The dielectric layer 1220 may extend over the top surfaces of the conductive traces 1210, and include via openings 1222 and 1224 (illustrated, e.g., in FIG. 19B) exposing portions of the routing traces 1212 and the inductor spiral traces 1214, respectively. That is, the dielectric layer 1220 may cover side surfaces and (partially) top surfaces of the conductive traces 1210.

Figure 20D:
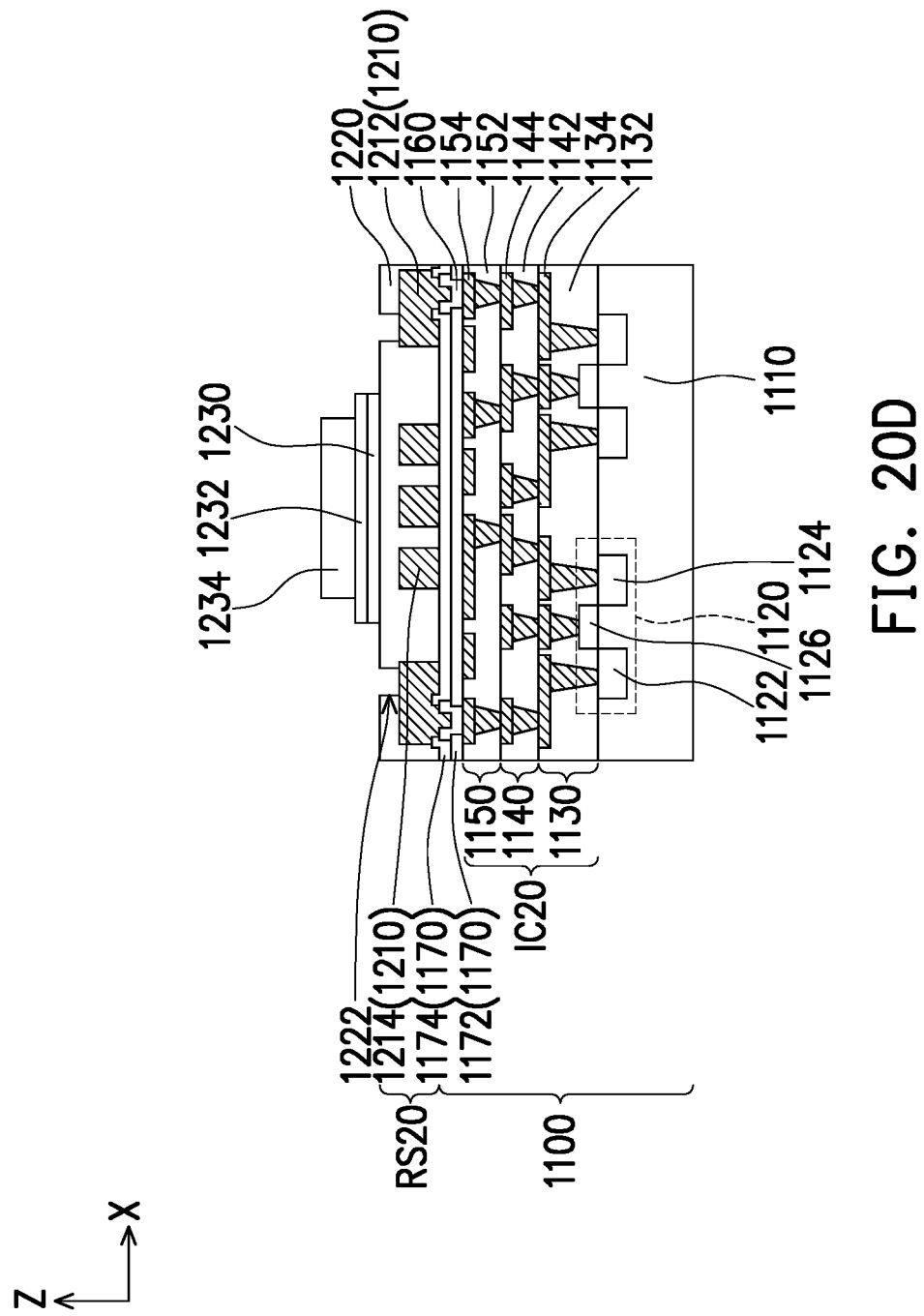

In FIG. 20D, the buffer layer 1230, the etch stop layer 1232 and the core material layer 1234 are formed on the dielectric layer 1220, overlying the inductor spiral traces 1214. In some embodiments, the buffer layer 1230, the etch stop layer 1232 and the core material layer 1234 may be formed following a similar process as previously described with reference from FIG. 6A to FIG. 10B. Briefly, the layers 1230, 1232, 1234 may be blanketly formed on the encapsulated semiconductor die(s) 1100, and be sequentially patterned with the use of increasingly larger auxiliary masks (such as the auxiliary masks 170, 172 of FIG. 7A and FIG. 9A) to obtain a buffer layer 1230 and an etch stop layer 1232 of substantially equal footprint and protruding with respect to the overlying core material layer 1234.

Figure 20E:
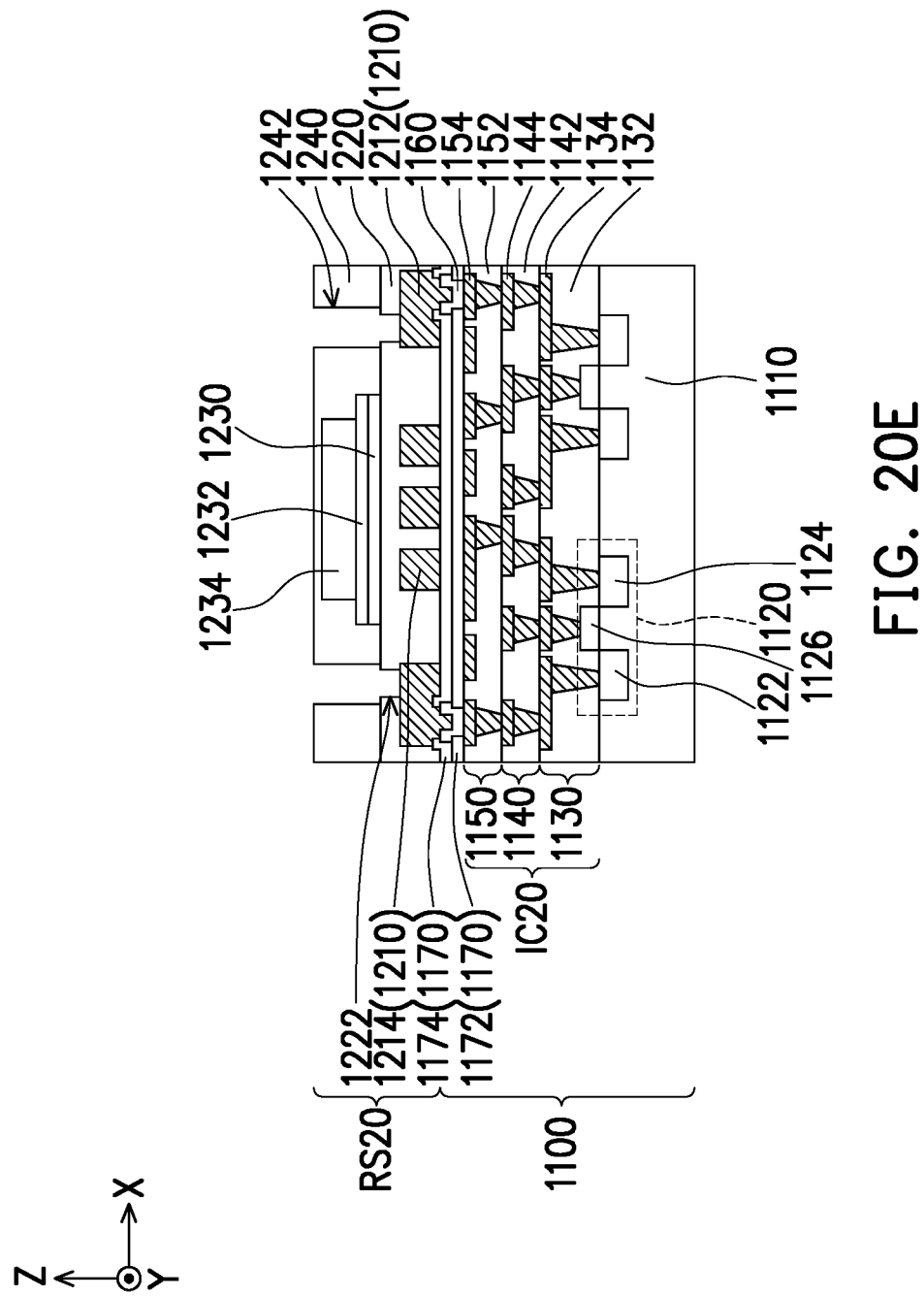
Figure 20F:
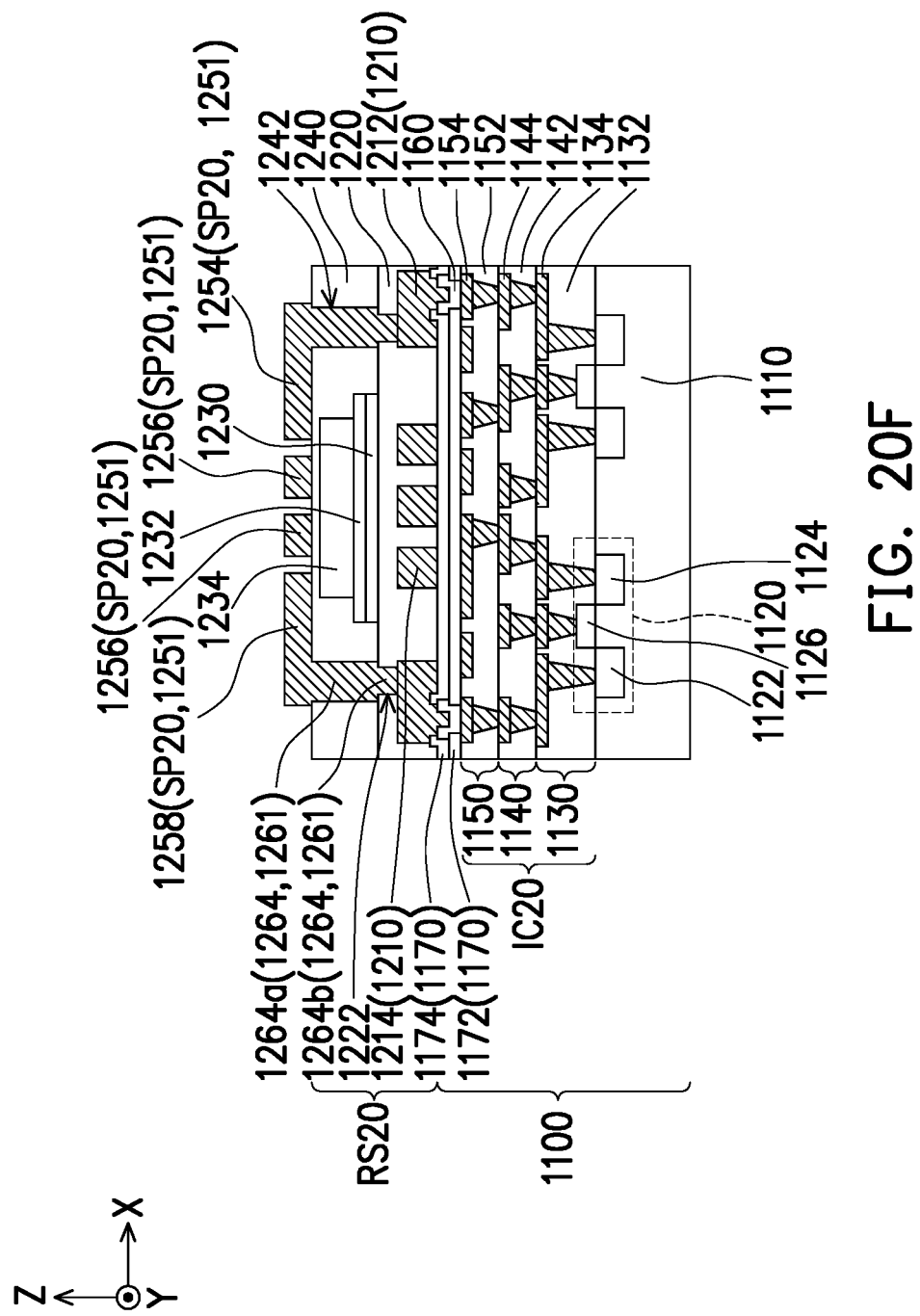

In FIG. 20E, the dielectric layer 1240 is formed on the dielectric layer 1220. The dielectric layer 1240 has via openings 1242 formed therethrough, exposing at their bottom the via openings 1222, 1224 (illustrated, e.g., in FIG. 19B) of the dielectric layer 1220, and portions of the dielectric layer 1220 surrounding the via openings 1222, 1224. That is, the via openings 1242 may be wider (along the X and/or Y directions) than the underlying via openings 1222, 1224. In some embodiments, the buffer layer 1230, the etch stop layer 1232, and the core material layer 1234 are buried underneath the dielectric layer 1240. In FIG. 20F, the conductive traces 1251 and the conductive vias 1261 are formed by disposing a conductive material in the via openings 1242 and on the dielectric layer 1240. An auxiliary mask (not shown) may be provided to determine the pattern of the conductive traces 1251 by depositing the conductive material within the openings of the auxiliary mask. The conductive vias 1261 may extend through the dielectric layers 1240 and 1220, to contact the routing traces 1212 and the inductor spiral traces 1214. In some embodiments, the conductive vias 1261 include wider portions (such as the portion 1264a) formed in the via openings 1242 of the dielectric layer 1240, and narrower portions (such as the portion 1264b) protruding from the wider portions and formed within the via openings 1222 and 1224 (illustrated, e.g., in FIG. 19B) of the dielectric layer 1220. In some embodiments, the conductive traces 1251 extend on the top surface of the dielectric layer 1240. Following similar process steps to the ones previously described, upper dielectric layers (e.g., the dielectric layer 1280), under-bump metallurgies 1290, and connective terminals 1300 may be formed to obtain the semiconductor device SD20 illustrated in FIG. 18.

Figure 21B:
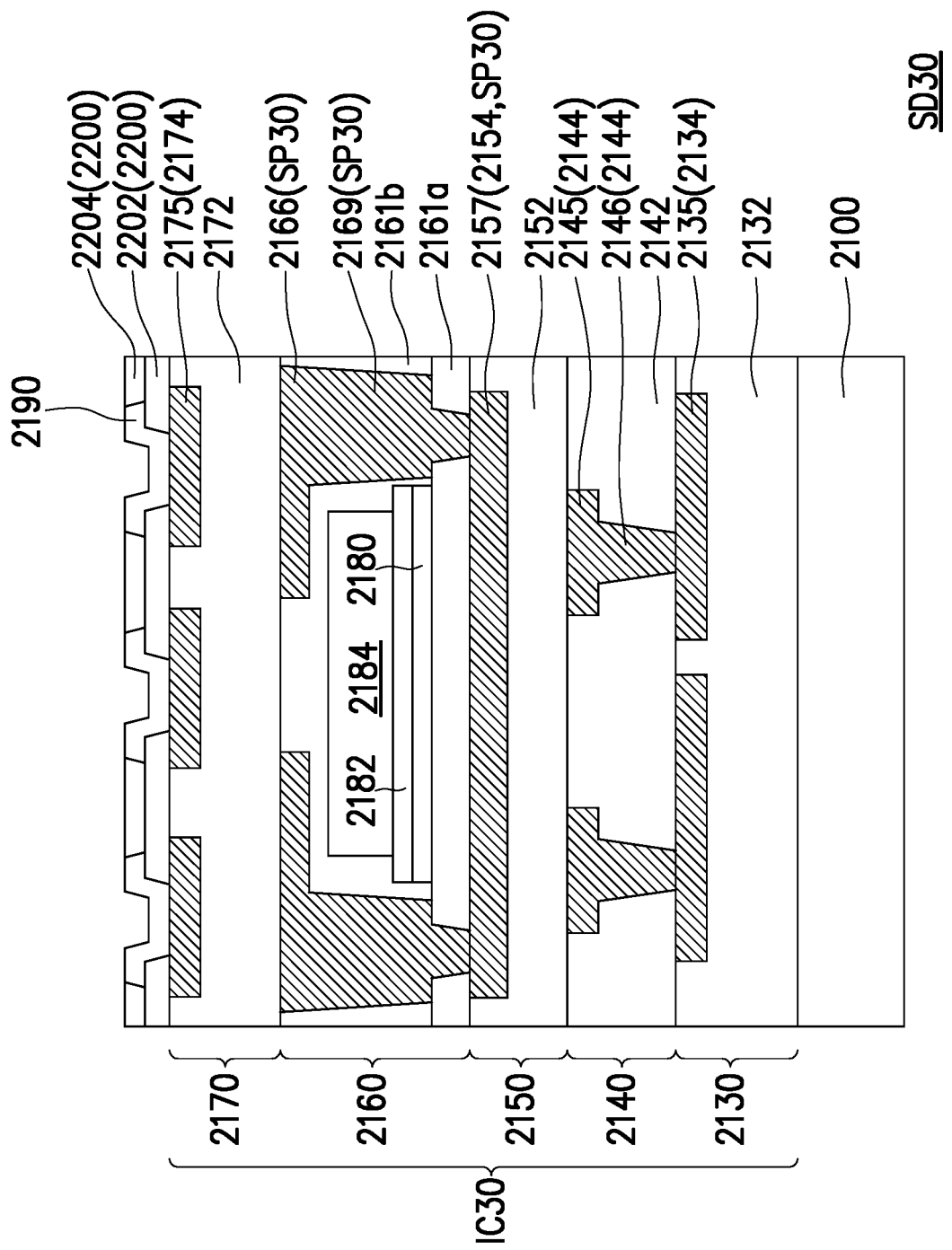

FIG. 21A and FIG. 21B are schematic cross-sectional views of a semiconductor device SD30 according to some embodiments of the disclosure. The view of FIG. 21B is taken in a YZ plane at the level height of the line IV-IV' along the X direction. The semiconductor device SD30 may be a semiconductor die, having a similar structure to the ones previously described for the semiconductor dies 110 of FIG. 1A or 1100 of FIG. 18. Aspects discussed in the following with respect to the semiconductor device SD30 may apply also for the semiconductor dies 110 and the semiconductor dies 1100. Briefly, the semiconductor device SD30 may include a semiconductor substrate 2100 having circuit devices formed thereon. For example, in FIG. 21 are illustrated a transistor 2110 and a transistor 2120 formed on the semiconductor substrate 2100. The transistor 2110 includes a pair of source and drain regions 2112, 2114 separated by a portion of semiconductor substrate 2100 which functions as a channel region of the transistor 2110. A gate structure 2116 is disposed on the channel region in between the source and drain regions 2112, 2114. In some embodiments, the source and drain regions 2112, 2114 may be doped, for example with n-type materials or p-type materials. In some embodiments, the transistor 2120 also includes a pair of source and drain regions 2122, 2124, which may be optionally doped with n-type materials or p-type materials. In some embodiments, the source and drain regions 2122, 2124 are doped with materials of opposite conductivity type with respect to the source and drain regions 2112, 2114. The source and drain regions 2122, 2124 may be disposed within a larger region 2126 having different dopants and/or different concentration of dopants with respect to the source and drain regions 2122, 2124. A gate structure 2128 may be disposed on the region 2126 in between the source and drain regions 2122, 2124. It should be noted that the disclosure does not limit the architecture of the transistors 2110, 2120. For example, the transistors 2110, 2120 may be planar field effect transistors, fin field effect transistors, gate all around transistors, or the like with different gate contact schemes (e.g., front-gate, back-gate, double-gate, staggered, and so on). Although in FIG. 21A are illustrated transistors 2110, 2120 formed on the semiconductor substrate 2100, other active devices (e.g., diodes or the like) and/or passive devices (e.g., capacitors, resistors, or the like) may also be formed as the circuit devices.

An interconnection structure IC30 may be formed over the semiconductor substrate 2100, to integrate the circuit devices such as the transistor 2110, 2120 in larger circuits. The interconnection structure IC30 may include one or more interconnection tiers 2130, 2140, 2150, 2160, 2170 stacked over the semiconductor substrate 2100. Each interconnection tier 2130, 2140, 2150, 2160, 2170 may include one or more dielectric layers 2132, 2142, 2152, 2161a, 2161b, 2172 and conductive patterns 2134, 2144, 2154, 2162, 2174 extending on and through the dielectric layers 2132, 2142, 2152, 2161a, 2161b, 2172 to integrate the circuit devices (e.g., the transistors 2110, 2120) formed on the semiconductor substrate 2100 in functional circuits. The conductive patterns 2134, 2144, 2154, 2162, 2174 include routing traces 2135, 2145, 2155, 2163, 2175, and routing vias 2136, 2146, 2156, 2164, 2176.

In some embodiments, an inductor IN30 is formed within the interconnection structure IC30. The inductor IN30 may include a conductive spiral SP30 wound around a core CR. The conductive spiral SP30 may be formed by inductor traces 2157, 2165, 2166, 2167, and the inductor spiral vias 2169. The inductor spiral traces 2157, 2166 are connected to each other and to the inductor terminal traces 2165, 2167 by the inductor spiral vias 2169, while inductor contact vias 2168 connects the inductor terminal traces 2165, 2167 to the other conductive patterns (e.g., 2154 or 2174) of the interconnection structure IC30. In the core CR, the buffer layer 2180, the etch stop layer 2182, and the core material layer 2184 are sequentially stacked in between the dielectric layers 2161a and 2161b. The inductor IN30 may have a similar structure and be formed following similar processes as previously described for the inductors IN10 of FIG. 17A, IN15 of FIG. 17B, and IN20 of FIG. 18. It should be noted that while the proportions of the inductor IN30 may be the same or similar to the proportions indicated above for the inductors IN10, IN15, IN20 disclosed above, the inductor IN30 may be scaled down so as to better integrate within the interconnection structure IC30. In some embodiments, by having the edges of the buffer layer 2180 and the etch stop layer 2182 misaligned with respect to the edges of the core material layer 2184, mechanical stress which may be generated in view of the rigidity of the core material layer 2184 may be effectively dispersed, so as to reduce or even prevent delamination with the surrounding dielectric layers 2161a, 2161b. Therefore, reliability of the semiconductor device SD30 may increase.

In some embodiments, the semiconductor device SD30 may further include contact pads 2190 formed on some of the uppermost conductive patterns 2174, similar to the contact pads 113 of FIG. 1A, for example. A passivation layer 2200 may extend on the interconnection structure IC30 to protect the interconnection structure IC30. The passivation layer 2200 may have a composite structure, including multiple layers 2202, 2204, for example. The passivation layer 2200 may surround the contact pads 2190, and even partially cover the top surfaces of the contact pads 2190. The passivation layer 2200, however, includes opening exposing at least portions of the contact pads 2190.

Based on the above, a semiconductor device according to some embodiments of the disclosure includes an inductor having a conductive wire wound around a core. The core includes a core material layer and at least one base layer selected from a buffer layer, an etch stop layer, or both a buffer layer and an etch stop layer. In some embodiments, by having the base layer protruding with respect to the core material layer, mechanical stress generated at the interface between the core material layer and surrounding dielectric layers may be effectively dissipated. As illustrated by the above embodiments, the inductor may be formed in a redistribution structure of a semiconductor package (as in the semiconductor devices SD10 of FIG. 15A, SD12 of FIG. 16, SD15 of FIG. 17B, SD20 of FIG. 18) or, for example, in an interconnection structure of a semiconductor die (as in the semiconductor device SD30 of FIG. 21A). According to the disclosure, a semiconductor device may be embodied in many aspects, such as a semiconductor package (as the semiconductor devices SD10, SD15 and SD20), a semiconductor package integrated in larger devices (as the semiconductor device SD12), a semiconductor die (as the semiconductor device SD30), and so on.

In accordance with some embodiments of the disclosure, an inductor includes a core and a conductive spiral wound around the core. The core includes a buffer layer, an etch stop layer, and a core material layer sequentially stacked. The core material layer includes a ferromagnetic material. A total area of a vertical projection of the core material layer is smaller than an area occupied by the etch stop layer. The vertical projection of the core material layer falls entirely on the etch stop layer. The etch stop layer horizontally protrudes with respect to the core material layer.

In accordance with some embodiments of the disclosure, a semiconductor device includes a semiconductor substrate, dielectric layers, conductive traces, conductive vias, a buffer layer, an etch stop layer, and a core material layer. The dielectric layers and the conductive traces are alternately stacked over the semiconductor substrate. The conductive vias extend through the dielectric layers to electrically connect the conductive traces with each other and with circuit devices formed on the semiconductor substrate. The buffer layer, the etch stop layer, and the core material layer are vertically disposed, in order, on each other in between a pair of dielectric layers of the dielectric layers. The conductive traces include inductor traces. The conductive vias include inductor vias. The inductor traces and the inductor vias are connected to each other to form an inductor wire winding around the pair of dielectric layers. Side edges of the buffer layer are vertically aligned with side edges of the etch stop layer. The side edges of the buffer layer and the side edges of the etch stop layer are vertically misaligned with side edges of the core material layer.

In accordance with some embodiments of the disclosure, a manufacturing method of a semiconductor device includes the following steps. A first conductive material is disposed to form first inductor spiral traces extending parallel to each other along a first direction and at a distance from each other along the second direction. A first dielectric layer is formed on the first inductor spiral traces. The first dielectric layer includes first openings exposing opposite ends of the first inductor spiral traces. A buffer material is blanketly disposed on the first dielectric layer and on the first inductor spiral traces in the first openings. An etch stop material is blanketly disposed on the buffer material. A ferromagnetic material is blanketly disposed on the etch stop material. The ferromagnetic material is removed from over the first openings to form a core material layer. The core material layer covers a first area overlapping the first inductor spiral traces. The etch stop material and the buffer material are removed from the first openings to respectively form an etch stop layer and a buffer layer. The etch stop layer and the buffer layer cover a second area overlapping the first inductor spiral traces. The first area is smaller than the second area. The first area is contained within the second area. A second dielectric layer if formed on the first dielectric layer to embed the buffer layer, the etch stop layer, and the core material layer. A second conductive material is disposed to form upper inductor traces extending on the second dielectric layer and to form inductor vias extending through the first dielectric layer and the second dielectric layer to connect the upper inductor traces with the first inductor spiral traces.

In accordance with some embodiments of the disclosure, a manufacturing method of a semiconductor package includes the following steps. An adhesive material is disposed on a circuit substrate beside at least one semiconductor die bonded to the circuit substrate. A metallic cover is placed on the adhesive material. The metallic cover extends over the semiconductor die. The circuit substrate is disposed on a bottom piece of a jig. An upper piece of the jig is disposed over the bottom piece of the jig. The upper piece of the jig is tightened to the bottom piece of the jig. By doing so, the metallic cover is pressed against the circuit substrate and the semiconductor die. The adhesive material is cured while the jig presses the metallic cover against the circuit substrate and the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate being part of a semiconductor die;
   dielectric layers and conductive traces alternately stacked over the semiconductor substrate;
   an encapsulant laterally wrapping the semiconductor substrate, the dielectric layers and the conductive traces being disposed on the encapsulant and the semiconductor die;
   conductive vias extending through the dielectric layers to electrically connect the conductive traces with each other and with circuit devices formed on the semiconductor substrate; and,
   in order, a buffer layer, an etch stop layer, and a core material layer vertically disposed on each other in between a pair of dielectric layers of the dielectric layers,
   wherein the conductive traces and the conductive vias respectively comprise inductor traces and inductor vias connected to each other to form an inductor wire winding around the pair of dielectric layers,
   side edges of the buffer layer are vertically aligned with side edges of the etch stop layer, and
   the side edges of the buffer layer and the side edges of the etch stop layer are vertically misaligned with side edges of the core material layer.

2. The semiconductor device of claim 1, wherein, in a first direction perpendicular to a vertical stacking direction of the etch stop layer and the core material layer, a protruding length of the etch stop layer on each side with respect to the core material layer is in the range of 0.125% to 3% of a total length of the core material layer in the first direction.

3. The semiconductor device of claim 2, wherein, in a second direction perpendicular to the first direction and to the vertical stacking direction, a protruding width of the etch stop layer on each side with respect to the core material layer is in the range of 0.5% to 15% of a total width of the core material layer in the second direction.

4. The semiconductor device of claim 1, wherein the core material layer comprises iron, cobalt, nickel, manganese, boron, an alloy thereof, a compound thereof, or a combination thereof.

5. The semiconductor device of claim 1, wherein a stack of the buffer layer, the etch stop layer, and the core material layer is directly over the encapsulant.

6. The semiconductor device of claim 1, further comprising:
   contact pads, disposed on topmost conductive traces of the conductive traces, and
   a protective layer, disposed on the topmost dielectric layer of the dielectric layers and the topmost conductive traces,
   wherein the protective layer includes openings exposing at least portions of the contact pads, and
   the conductive traces electrically connect the contact pads to the circuit devices.

7. The semiconductor device of claim 1, wherein a total area of a vertical projection of the core material layer is smaller than an area occupied by the etch stop layer, and the etch stop layer horizontally protrudes with respect to the core material layer.

8. The semiconductor device of claim 1, wherein a vertical projection of the etch stop layer coincides with a total area occupied by the buffer layer.

9. The semiconductor device of claim 1, wherein the etch stop layer comprises cobalt, tantalum, an oxide thereof, or a combination thereof.

10. The semiconductor device of claim 1, wherein the buffer layer comprises silicon, silicon nitride, or a combination thereof.

11. A semiconductor device, comprising:
a semiconductor substrate being a part of a semiconductor die;
dielectric layers disposed over the semiconductor substrate, the dielectric layers being portions of a redistribution structure;
an encapsulant extending along the semiconductor die and disposed below the redistribution structure;
conductive patterns disposed over the semiconductor substrate and covered by the dielectric layers, the conductive patterns comprising an inductor pattern; and
a core covered by the dielectric layers, and the core comprising a buffer layer, an etch stop layer, and a core material layer sequentially stacked, wherein the inductor pattern wound around the core, and a total area of a vertical projection of the core material layer is smaller than an area occupied by the etch stop layer.

12. The semiconductor device of claim 11, wherein the vertical projection of the core material layer falls entirely on the etch stop layer, and the etch stop layer horizontally protrudes with respect to the core material layer.

13. The semiconductor device of claim 11, wherein the core material layer comprises a ferromagnetic material.

14. The semiconductor device of claim 11, wherein the inductor pattern comprises:
first inductor spiral traces disposed below the core;
second inductor spiral traces disposed above the core and extending at an angle with respect to the first inductor spiral traces; and
inductor spiral vias disposed at the sides of the core and connecting the first inductor spiral traces to the second inductor spiral traces.

15. The semiconductor device of claim 11, wherein the core is vertically and laterally offset from the semiconductor die.

16. A semiconductor device, comprising:
dielectric layers disposed over a semiconductor substrate, the dielectric layers being portions of a redistribution structure, and the semiconductor substrate is a part of a semiconductor die;
an encapsulant extending along the semiconductor die and disposed below the redistribution structure;
a core disposed over the semiconductor substrate and covered by the dielectric layers, and the core comprising a buffer layer, an etch stop layer, and a core material layer sequentially stacked, wherein a side edge of the etch stop layer is laterally protruded from a side edge of the core material layer, and the side edge of the etch stop layer is vertically aligned with a side edge of the buffer layer; and
an inductor pattern wound around the core and covered by the dielectric layers, the inductor pattern comprising spiral traces and spiral vias connected to the spiral traces.

17. The semiconductor device of claim 16, wherein the core is disposed in between a pair of dielectric layers of the dielectric layers, and the inductor pattern is wound around the pair of dielectric layers of the dielectric layers.

18. The semiconductor device of claim 16, wherein the core is disposed directly over the encapsulant.

19. The semiconductor device of claim 16, wherein the core material layer comprises a ferromagnetic material.

20. The semiconductor device of claim 16, wherein the buffer layer comprises silicon, silicon nitride, or a combination thereof.

* * * * *